United States Patent [19]
Komori et al.

[11] Patent Number: 5,427,966
[45] Date of Patent: Jun. 27, 1995

[54] PROCESS FOR FABRICATING A SEMICONDUCTOR DEVICE HAVING FLOATING GATE AND CONTROL GATE ELECTRODES

[75] Inventors: Kazuhiro Komori, Higashikurume; Toshiaki Nishimoto, Tama, both of Japan

[73] Assignee: Hitachi, Ltd., Tokyo, Japan

[21] Appl. No.: 101,579

[22] Filed: Aug. 3, 1993

Related U.S. Application Data

[62] Division of Ser. No. 607,871, Nov. 1, 1990, Pat. No. 5,235,200.

[30] Foreign Application Priority Data

Jan. 29, 1990 [JP] Japan .................. 2-18598

[51] Int. Cl.⁶ .......................... H01L 21/265
[52] U.S. Cl. .......................... 437/43; 437/48; 437/52; 437/49
[58] Field of Search .......................... 437/43, 49, 48, 52

[56] References Cited

U.S. PATENT DOCUMENTS 4,663,645  5/1987  Komori et al. .

FOREIGN PATENT DOCUMENTS

| | | |
|---|---|---|
| 58-111364 | 7/1983 | Japan . |
| 62-43180 | 2/1987 | Japan . |
| 56-45068 | 4/1987 | Japan . |
| 62-210678 | 9/1987 | Japan . |
| 63-122163 | 5/1988 | Japan . |

OTHER PUBLICATIONS

Mitchell, et al, "A New Self-Aligned Planar Array Cell for Ultra High Density EPROM", 1987 IEDM Tech. Dig. pp. 548–557.

Mukheyee, et al, IEDM Technical Digest, No. 26.1, pp. 616–619 Dec. 1985.

*Primary Examiner*—Olik Chaudhuri
*Assistant Examiner*—Richard A. Booth
*Attorney, Agent, or Firm*—Antonelli, Terry, Stout & Kraus

[57] ABSTRACT

Herein disclosed is a semiconductor integrated circuit device having a nonvolatile memory function and including a memory cell composed of a field effect transistor having a floating gate electrode and a control gate electrode. A first insulating film for element isolation is buried between the floating gate electrodes. The size of the drain region of the field effect transistor is substantially regulated by both the gap between the first insulating films adjacent to the drain region and the gap between the control gate electrodes adjacent to the drain region. The gaps between the data line at the connection portion with the drain region and the first insulating films individually adjacent to the drain region are equalized. The gaps between the data line at the connection portion with the drain region and the floating gate electrodes or control gate electrodes individually adjacent to the drain region are equalized.

17 Claims, 23 Drawing Sheets

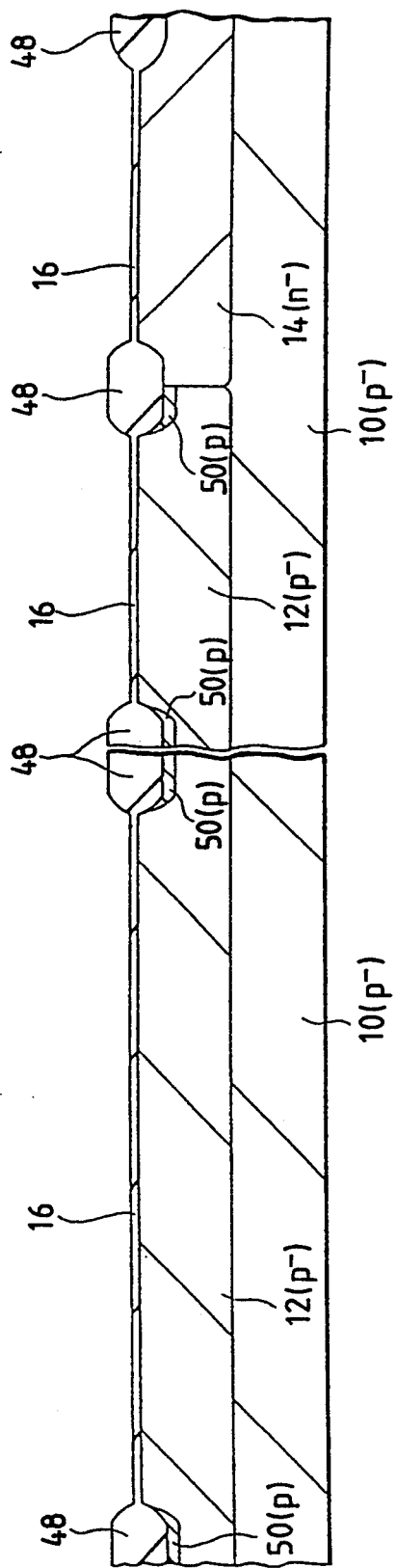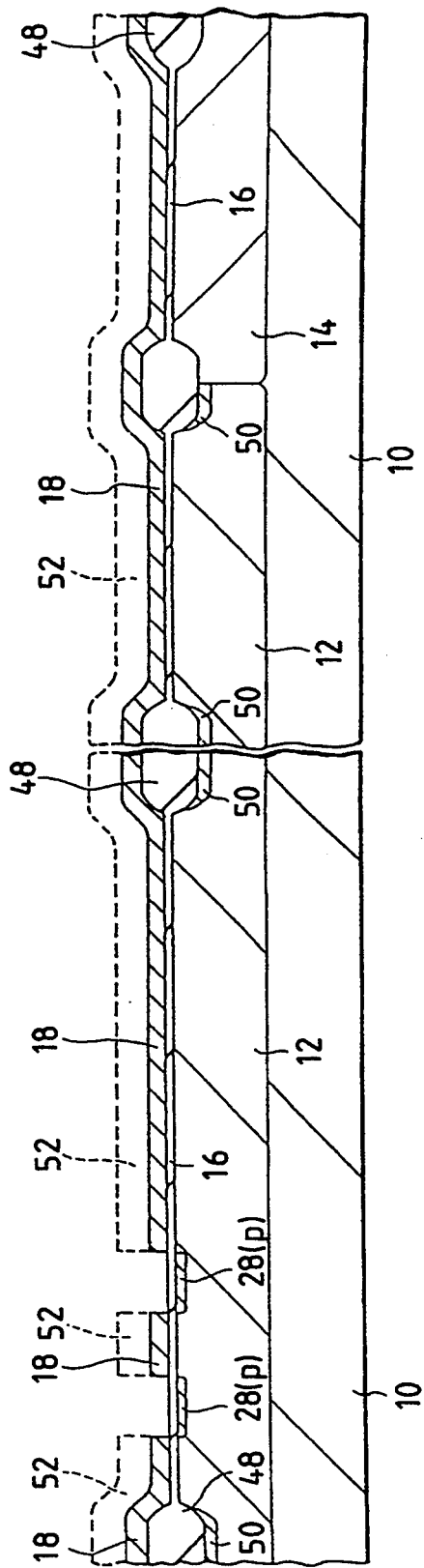

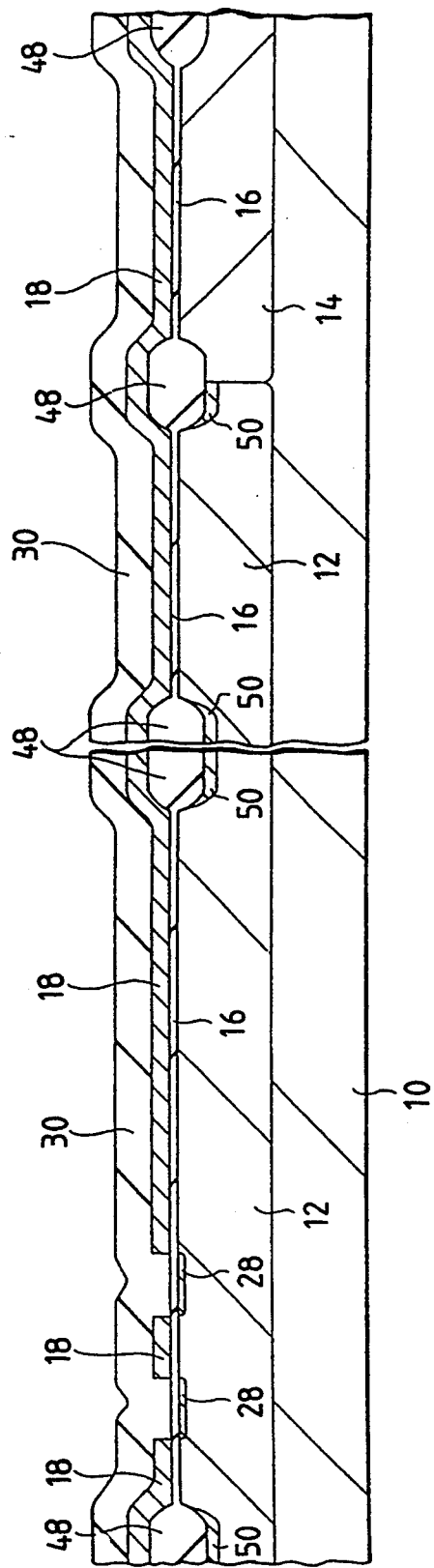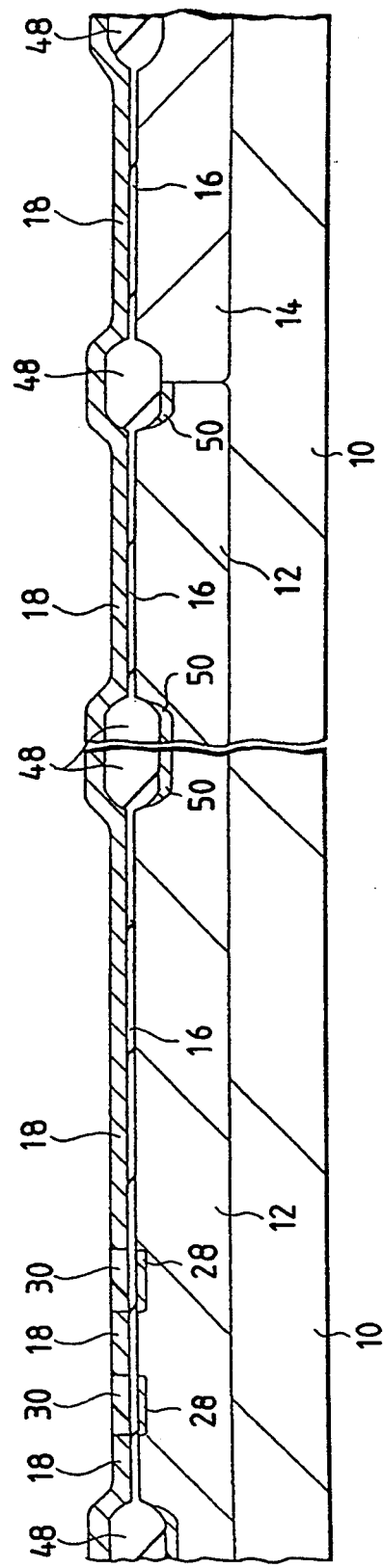

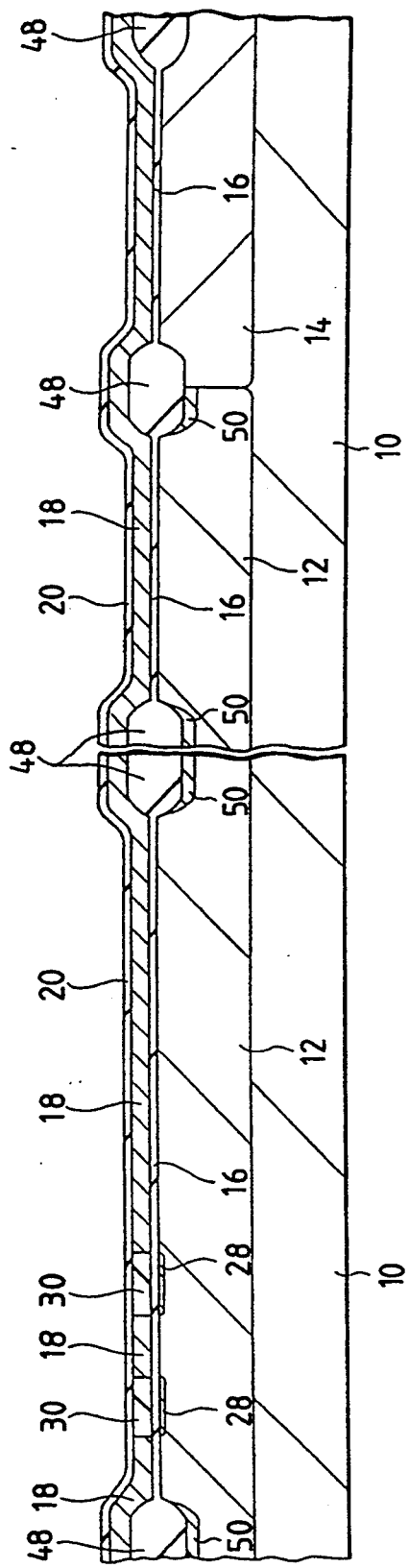
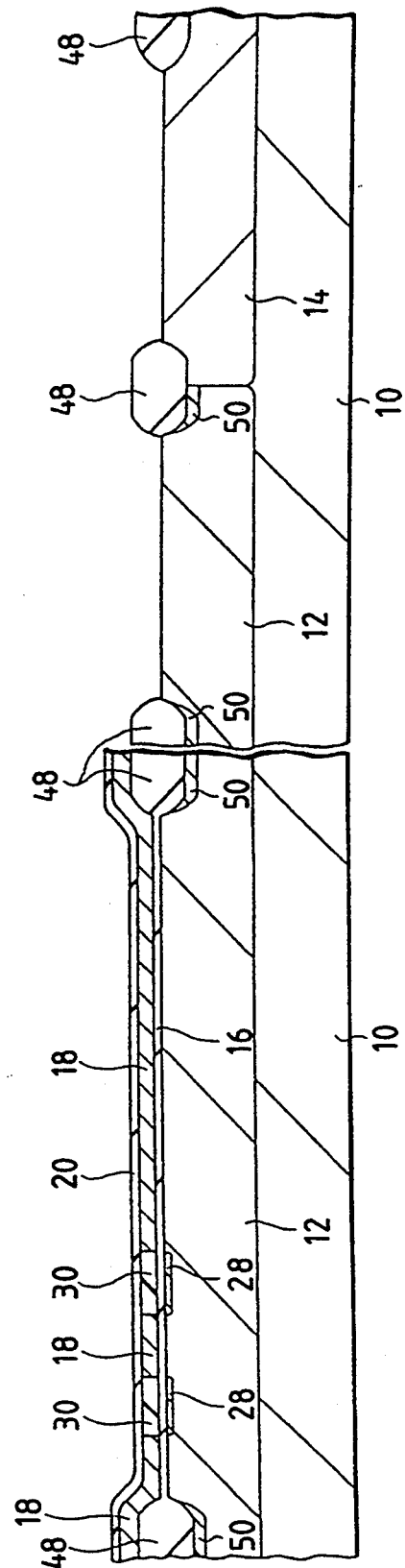
FIG. 4E
FIG. 4F

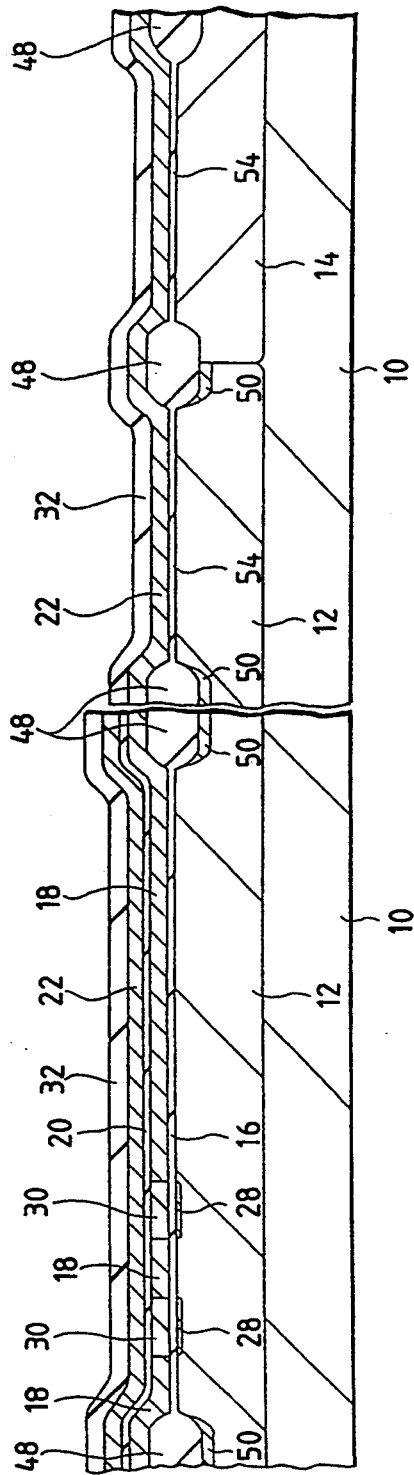
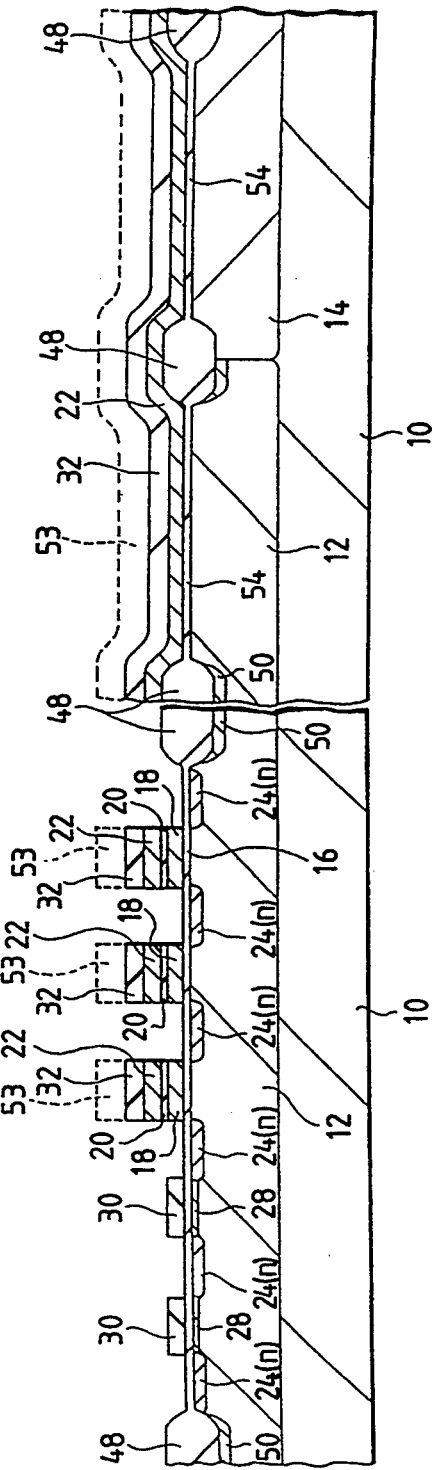

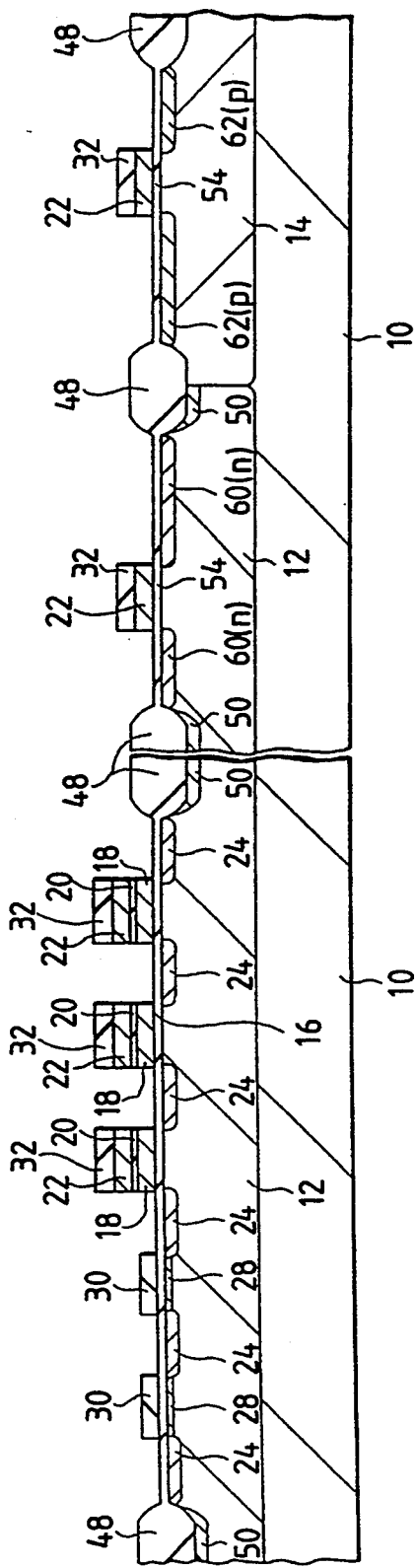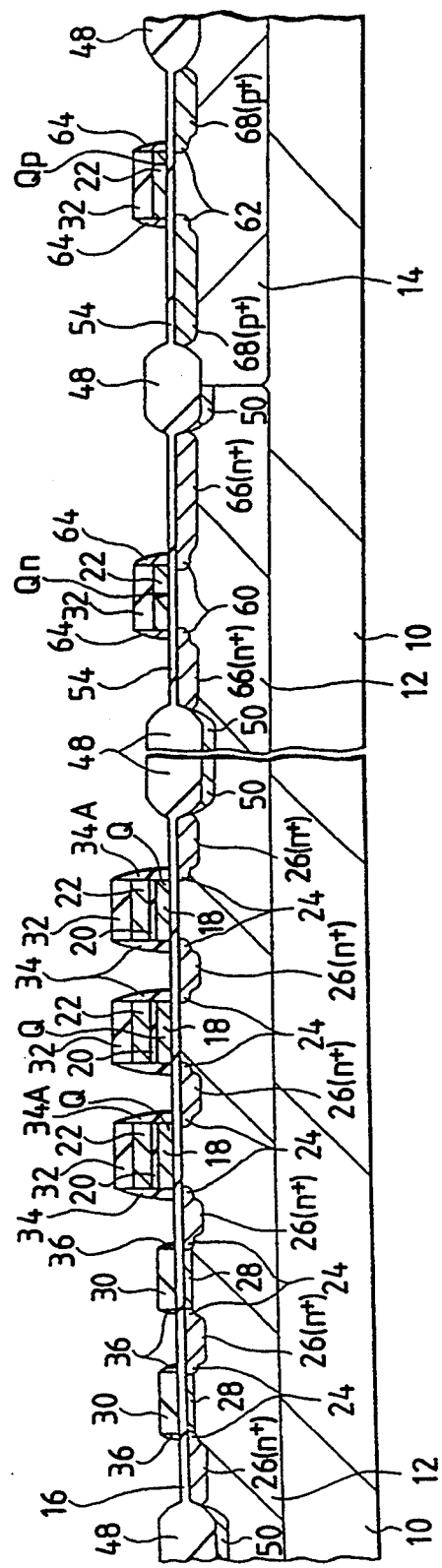

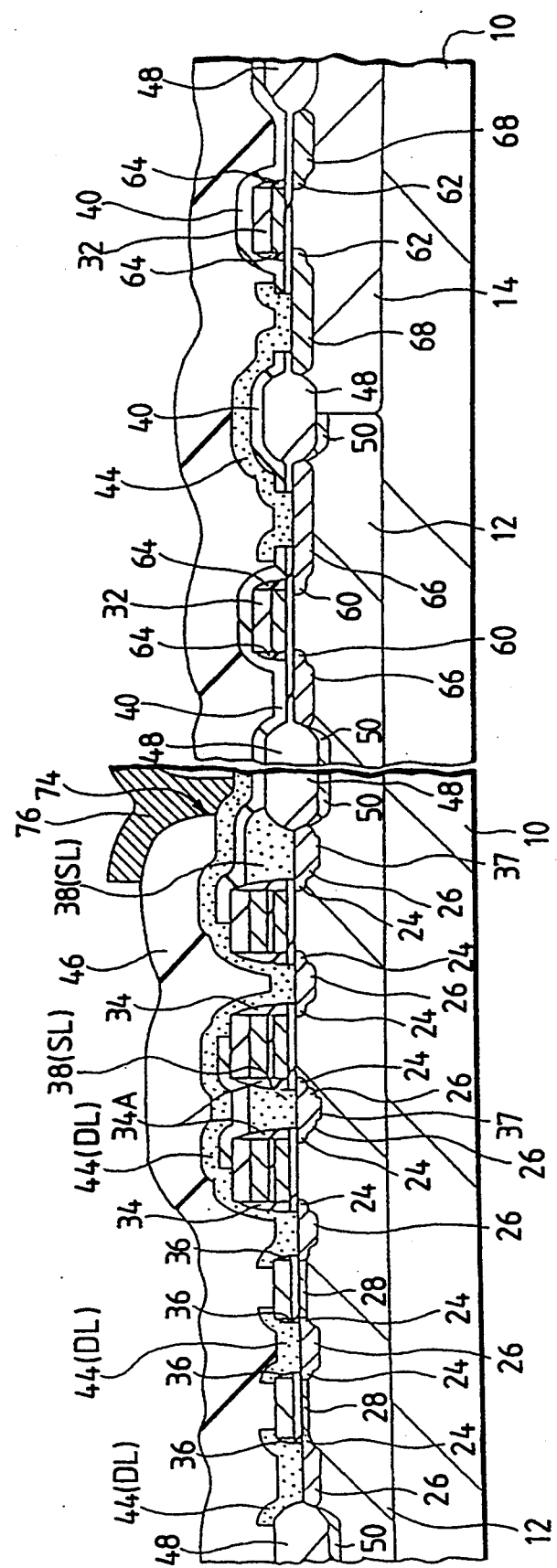

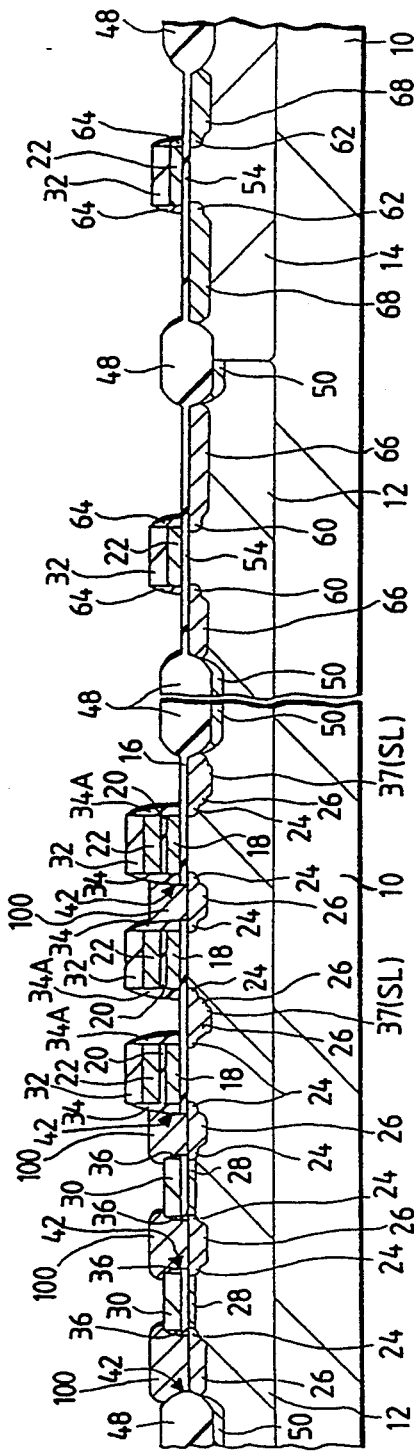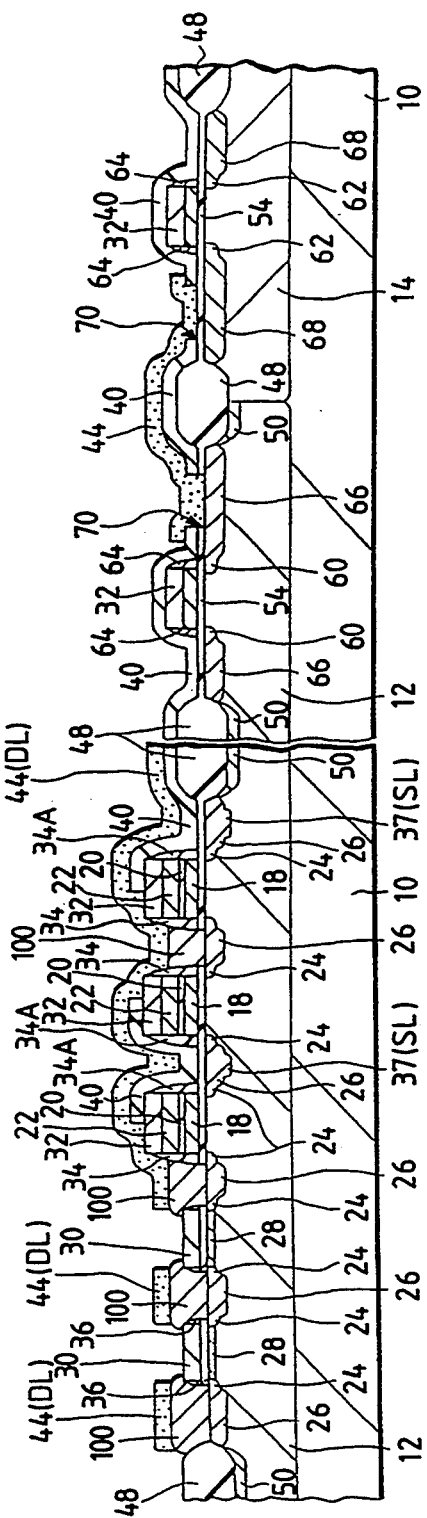
FIG. 8A
FIG. 8B

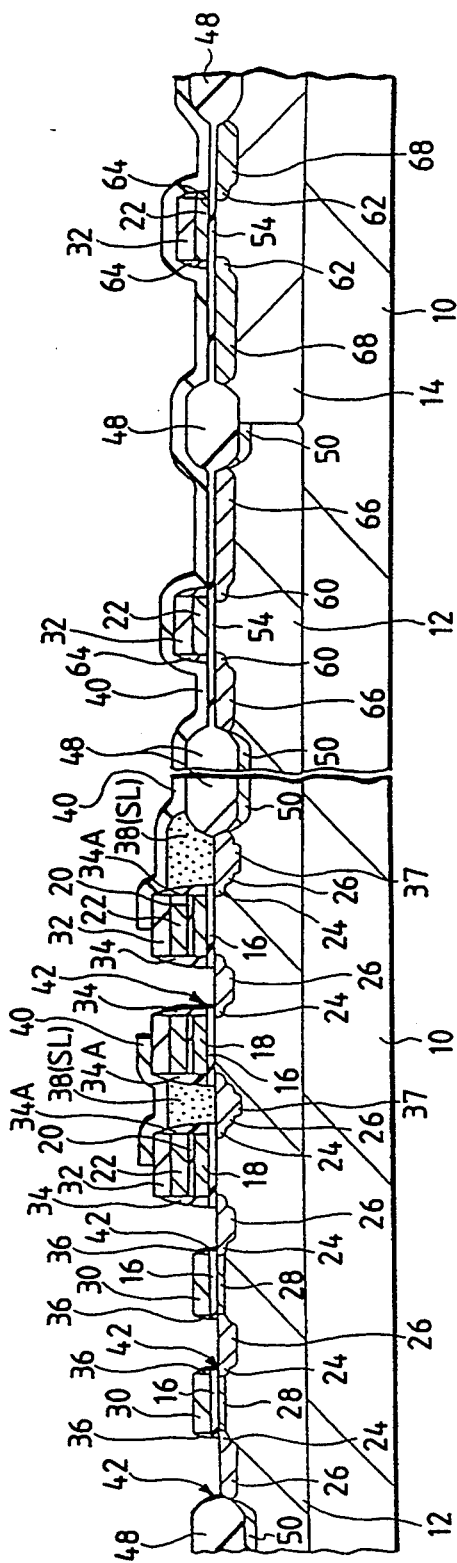
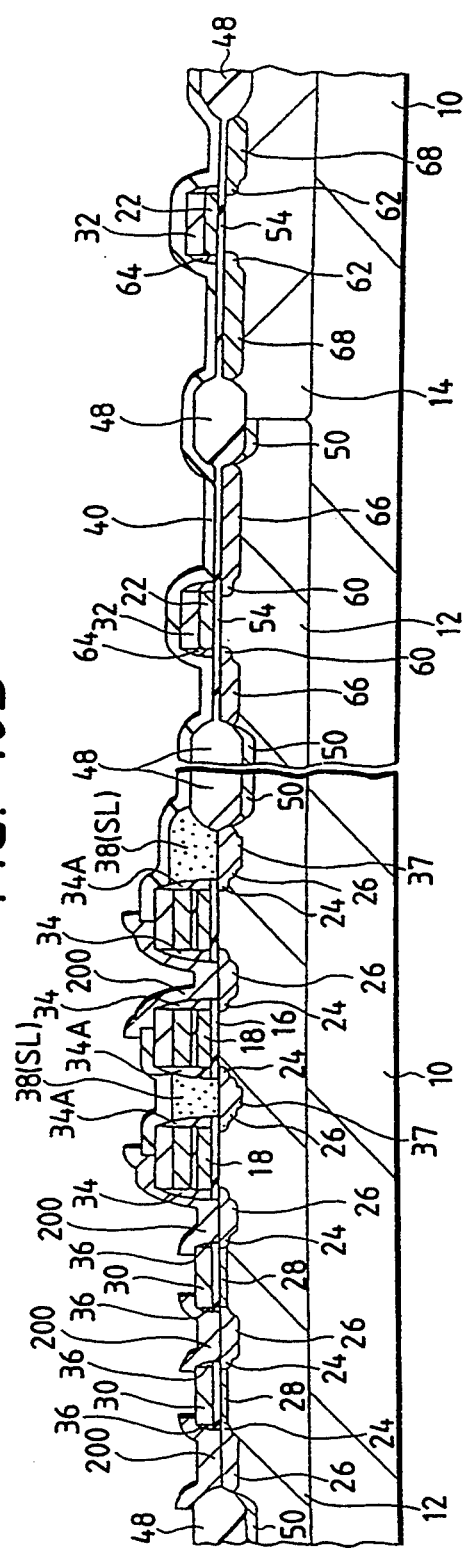

PROCESS FOR FABRICATING A SEMICONDUCTOR DEVICE HAVING FLOATING GATE AND CONTROL GATE ELECTRODES

This is a divisional of application Ser. No. 07/607,871, filed Nov. 1, 1990, now U.S. Pat. No. 5,235,200.

BACKGROUND OF THE INVENTION

The present invention relates to a technology which is effective when applied to a semiconductor integrated circuit device and, more particularly, to a technology which is effective when applied to a semiconductor integrated circuit device equipped with a one-element type memory cell composed of a field effect transistor (FET) having a floating gate electrode and a control gate electrode.

A known semiconductor integrated circuit device having a nonvolatile memory function is exemplified by an EPROM (Erasable Programmable Read Only Memory) and a flash type E²PROM (Electrically Erasable Programmable Read Only Memory).

In these semiconductor integrated circuit devices, the memory cell for data storage is constructed of a floating gate electrode, which is formed over a semiconductor substrate through a first insulating film, and a control gate electrode which is formed over the floating gate electrode through a second insulating film.

The aforementioned field effect transistor constituting the memory cell is disposed at each interconnection of data lines and word lines. Each word line is connected with the control gate of the field effect transistor. This field effect transistor has its source region connected with a source line (e.g., an n-type semiconductor region), which is formed integrally therewith, and its drain region connected with each data line. The drain region of the aforementioned field effect transistor and the data line are connected through a connection hole which is formed in an inter-layer insulating film covering the memory cell.

On the other hand, the element isolating region of the aforementioned field effect transistor is formed of a field insulating film which is formed by selective oxidation.

The structure of the aforementioned memory cell is disclosed in U.S. Pat. No. 4,663,645 or 1985 IEDM Tech. Dig. pp 616 to 619, for example.

SUMMARY OF THE INVENTION

After having investigated the technology for reducing the size of the memory cell of the aforementioned semiconductor integrated circuit device, we have found out the following problems.

There has been proposed a technology (as disclosed in Japanese Patent Laid-Open No. 62-43180) for reducing the width of the aforementioned element isolating region to integrate the EPROM highly by forming the element isolating region of an element isolating groove which is formed in self-alignment with the floating gate electrode.

According to this technology, however, by reducing the width of the element isolating region, the memory cell size can be reduced in a direction, in which the word lines extend, but not in a direction in which the data lines extend.

On the other hand, the aforementioned connection hole is formed by patterning a photo resist formed over an Inter-layer insulating film to form a predetermined mask and by etching it with the mask. This connection hole is formed at a predetermined gap from the gate electrode and the element isolating region because a masking allowance is required. As a result, the area at the side of the drain region of the memory cell is increased to drop the degree of integration of the EPROM.

An object of the present invention is to provide technology capable of improving the degree of integration of a semiconductor integrated circuit device having a nonvolatile memory function.

Another object of the present invention is to provide a technology capable of forming a memory cell with the minimum treating size in the fabrication process.

Still another object of the present invention is to provide a technology capable of speeding up the data writing and reading operations.

The aforementioned and other objects and novel features of the present invention will become apparent from the following description to be made with reference to the accompanying drawings.

The summary of the representatives of the invention to be disclosed hereinafter will be briefly described in the following.

In a semiconductor integrated circuit device having a nonvolatile memory function, in which a memory cell is composed of a field effect transistor having a floating gate electrode and a control gate electrode, an element isolating insulating film for isolating the elements is buried between and in self-alignment with the floating gate electrodes, and the data lines are connected in self-alignment with the drain region which has its size substantially regulated by both the gap between the element isolating insulating films adjacent to the drain region of the aforementioned field effect transistor and the gap between the control gate electrodes adjacent to the drain region.

Moreover, the aforementioned drain region and the aforementioned data line are connected through a connection hole which is regulated by both an insulating film formed in self-alignment with the side walls of the floating gate electrode and the control gate electrode and an insulating film formed in self-alignment with the side walls of the element isolating insulating film.

Moreover, the source lines of the individual source regions of the field effect transistors, which are arranged in plurality in a predetermined direction, are formed of a conductive layer which is substantially buried between the control gate electrodes adjacent to the source lines.

Since, according to the means thus far described, the data line and the drain region of the field effect transistor of the memory cell can be connected without requiring the masking allowance in the fabrication process, the size of the drain region, which is substantially regulated by both the channel width or the gap between the element isolating insulating films adjacent to the aforementioned drain region and the gap between the control gate electrodes adjacent to the aforementioned drain region, can be made with a treating size requiring no registration allowance in the fabrication process.

As a result, the memory cell size can be reduced to improve the degree of integration of the semiconductor integrated circuit device.

In addition to the aforementioned channel width and the width between the control gate electrodes adjacent to the aforementioned drain region, moreover, the width of the element isolating insulating film can be made without requiring the masking allowance of the fabrication process. As a result, the memory cell can be formed with the treating size requiring no masking allowance in the fabrication process so that the degree of integration of the semiconductor integrated circuit device can be improved.

Since, moreover, the treating size requiring none of the aforementioned masking allowance in the fabrication process is regulated to the minimum treating size in the fabrication process, the memory cell can be formed with the minimum treating size in the fabrication process.

Since, moreover, the source line is formed of a conductive layer having a lower specific resistance than that of the semiconductor regions, it is possible to speed up the data writing and reading operations.

BRIEF DESCRIPTION OF THE DRAWINGS

FIGS. 4A to 4M are sections showing an essential portion of the EPROM of the Embodiment I of the present invention at individual fabrication steps;

FIGS. 8A to 8B are sections showing an essential portion of the semiconductor integrated circuit device of the Embodiment II of the present invention at individual fabrication steps;

FIGS. 10A to 10B are sections showing an essential portion of the semiconductor integrated circuit device of the Embodiment III of the present invention at individual fabrication steps;

DESCRIPTION OF THE PREFERRED EMBODIMENTS

Figure 1:
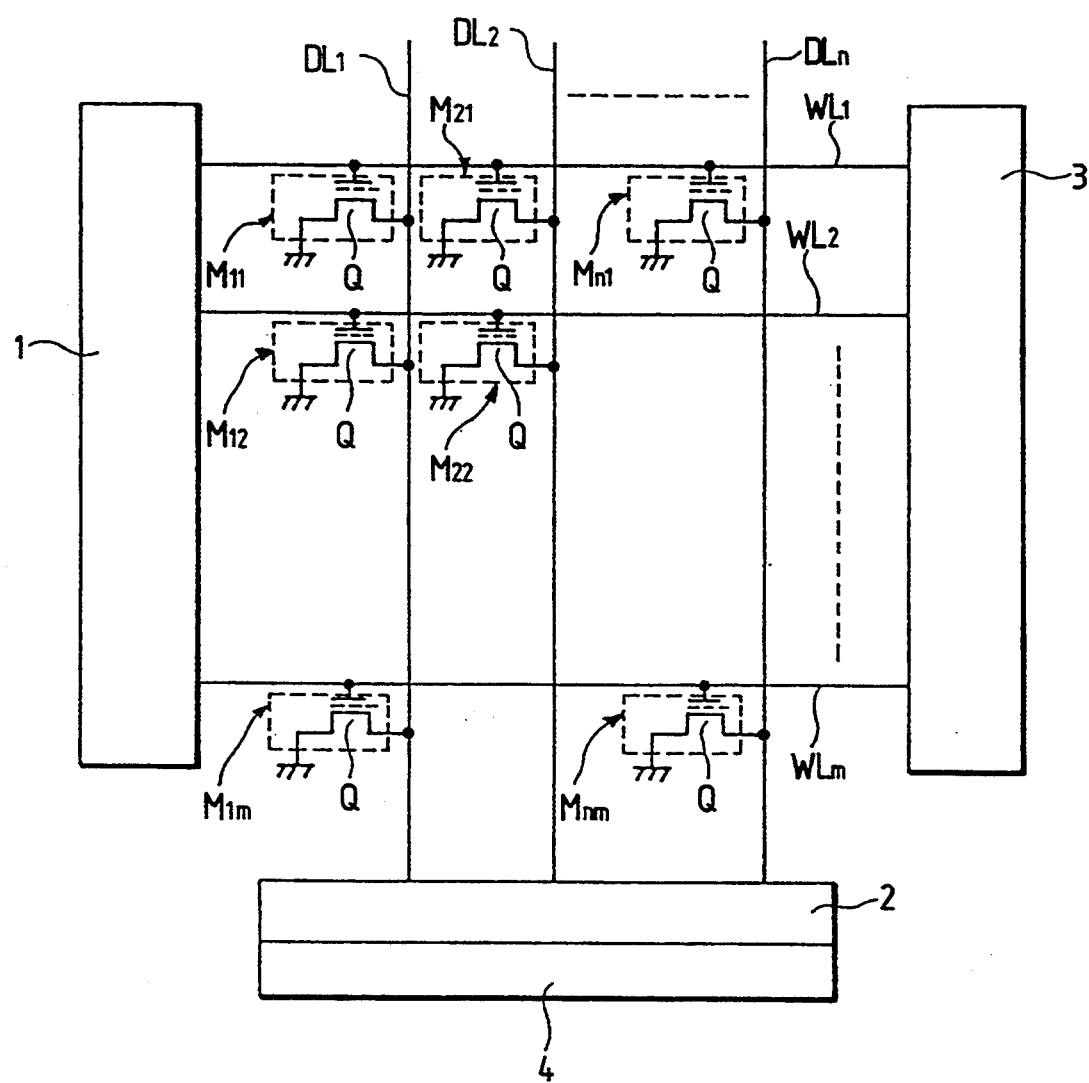
FIG. 1 is an equivalent circuit diagram showing the memory cell array of an EPROM according to Embodiment I of the present invention.

The structure of the present invention will be described in the following in connection with the embodiments thereof.

Incidentally, the parts having common functions are designated at common reference characters throughout all the Figures, and their repeated descriptions will be omitted.

[EMBODIMENT I]

First of all, the circuitry of the memory cell array of a semiconductor integrated circuit device according to a first embodiment of the present invention will be described in the following with reference to FIG. 1.

FIG. 1 is an equivalent circuit diagram showing an essential portion of the EPROM.

In FIG. 1: reference numeral 1 designates an X-decoder; numeral 2 a Y-decoder; numeral 3 a write circuit; numeral 4 a sense amplifier.

Word lines WL are led out from the X-decoder 1, and data lines DL are led out from the Y-decoder 2. The X-decoder 1 is constructed to select the word lines WL. The Y-decoder 2 is constructed to select the data lines DL.

Memory cells M are arranged at the individual intersections of the word lines WL and the data lines DL and are so connected as are shown.

Each memory cell M is constructed, as its basic structure, of a field effect transistor Q of a two-layered gate structure having a floating gate electrode and a control gate electrode connected with a predetermined word line WL.

The field effect transistor Q of the memory cell M has its drain region connected with a grounding line SL, as will be described hereinafter. The grounding line SL is extended in the same direction as that of the word line WL.

Thus, the memory cell array is constructed of a plurality of memory cells M which are arranged in a matrix form.

The write circuit 3 is provided to select a word line WL and write data in the memory cell M which is connected with the selected word line.

The sense amplifier 4 is provided to read the data from the memory cell M.

Next, the structure of the memory cell of the Embodiment I will be described in the following.

Figure 2:
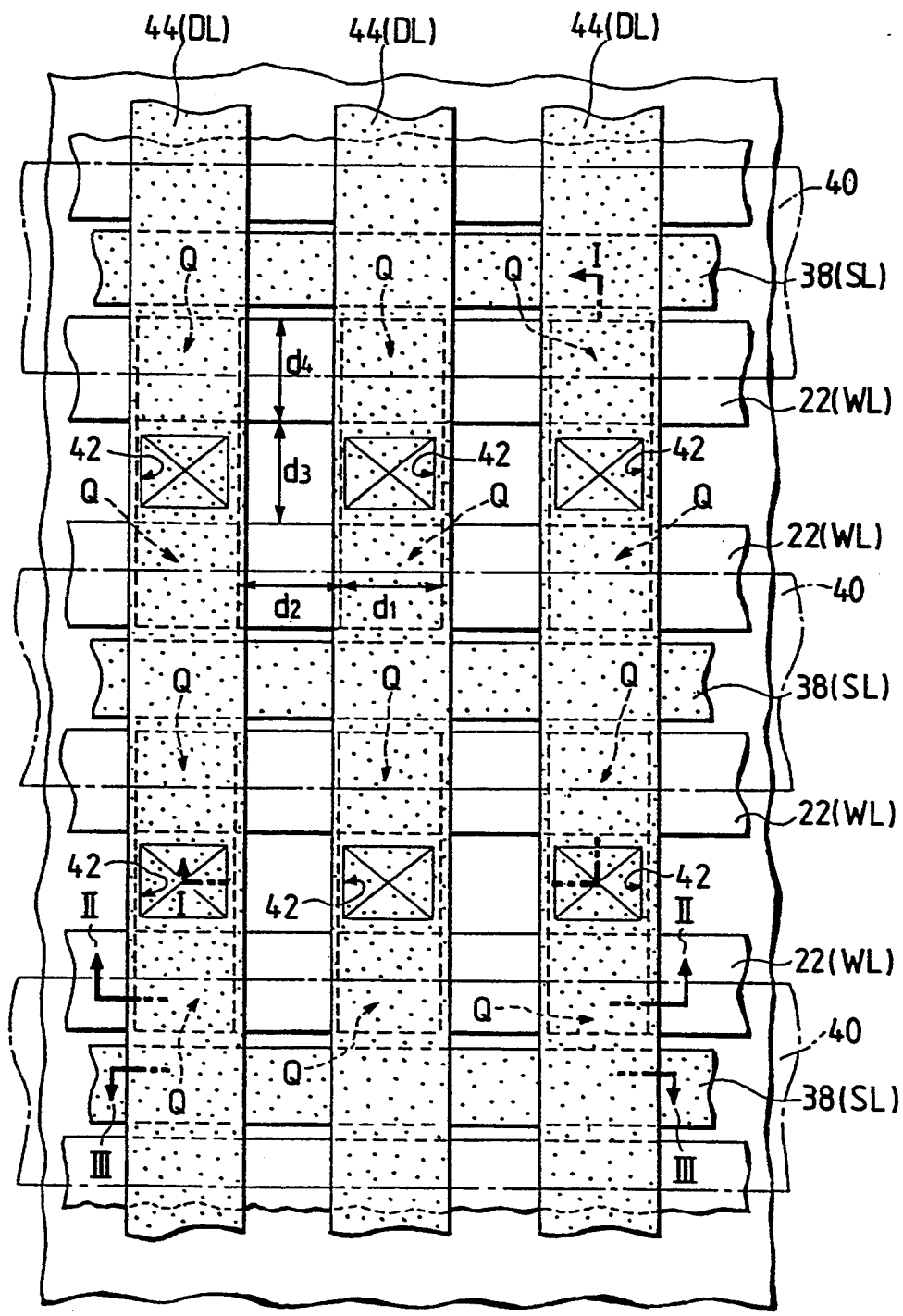
FIG. 2 is a top plan view showing the memory cell array of the EPROM of the Embodiment I of the present invention.
Figure 3A:
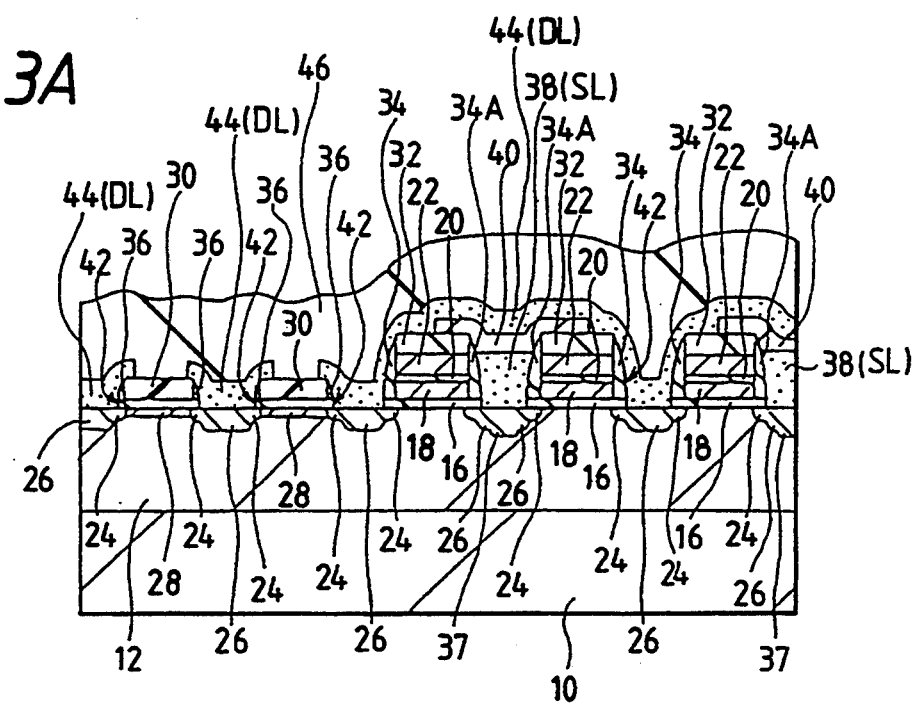
FIG. 3A is a section taken along line I—I' of FIG. 2.
Figure 3B:
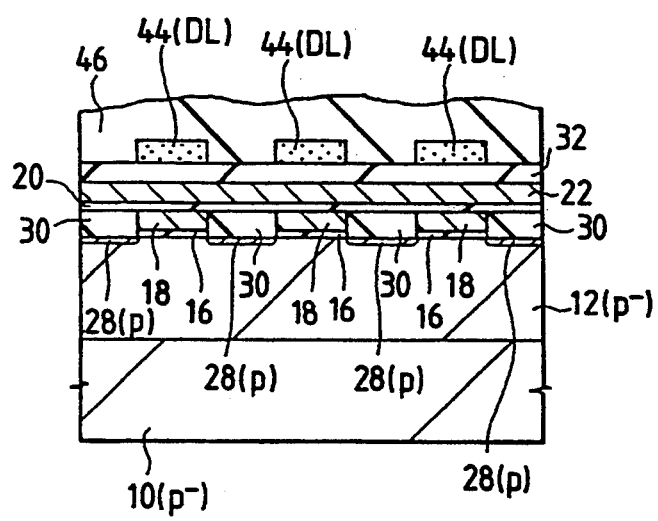
FIG. 3B is a section taken along line II—II' of FIG. 2.
Figure 3C:
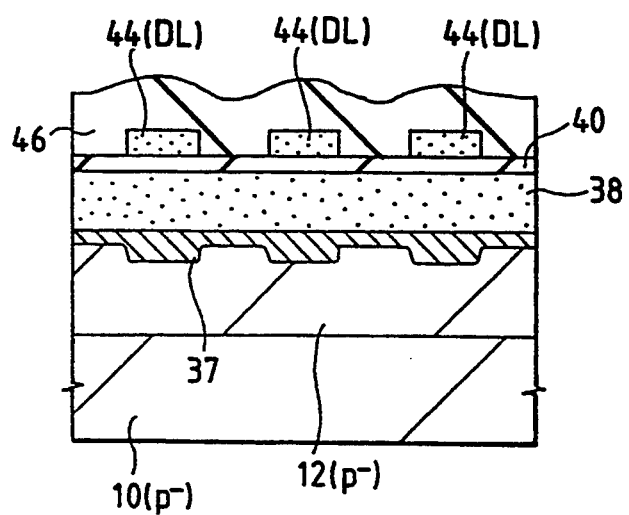
FIG. 3C is a section taken along line III—III' of FIG. 2.

FIG. 2 is a top plan view showing a portion of the memory cell array; FIG. 3A is a section taken along line I—I' of FIG. 2; FIG. 3B is a section taken along line II—II' of FIG. 2; and FIG. 3C is a section taken along line III—III' of FIG. 2. Incidentally, insulating films other than that to be intervened between the data lines and the source lines are omitted from FIG. 2 so that the illustrations may become more understandable.

In FIG. 2 and FIGS. 3A to 3C, reference 10 designates a p$^-$-type semiconductor substrate made of single crystalline silicon, and numeral 12 designates a p$^-$-type well region formed over the principal face of the semiconductor substrate 10.

Incidentally, the principal face of the remaining region of the semiconductor substrate 10 is formed with complementary MISFETs (Metal insulator Semiconductor FETs) for constituting peripheral circuits such as a decoder circuit, a write circuit or a sense amplifier. The complementary MISFET is constructed by combining an n-channel MISFET and a p-channel MISFET, which is formed over the principal face of an $n^-$-type well region 14 formed over the principal face of the semiconductor substrate 10.

The memory cell M of the EPROM is constructed of the field effect transistors Q. The memory cell M is composed mainly of the $p^-$-type well region 12, a gate insulating film 16, a floating gate electrode 18, an insulating film 20, a control gate electrode 22, a pair of n-type semiconductor region 24 acting as a source region and a drain region, and a pair of $n^-$-type semiconductor regions 26. The aforementioned p'-type well region 12 is used as a channel forming region.

In other words, the field effect transistor Q of the memory cell M is constructed of the two-layered gate structure and an LDD structure. The floating gate electrode 18 is formed of a first-layer gate electrode material in the fabrication process, as exemplified by a polycrystalline silicon film doped with an impurity (e.g., phosphor (P) or arsenic (As)) for reducing the resistance.

The floating gate electrode 18 is patterned to have a predetermined width $d_1$ (i.e., a channel width) in a column direction (i.e., in the extending direction of the source lines).

Numeral 28 designates a p-type channel stopper region, and numeral 30 designates an element isolating insulating film.

This element isolating insulating film 30 is formed to have a predetermined width $d_2$ in the column direction and buried in self-alignment with respect to the floating gate electrode 18. In other words, the aforementioned channel width $d_1$ is regulated by the gap between the element isolating insulating films adjacent to the drain regions 24.

The element isolating insulating film 30 is buried between the floating gate electrodes 18 by etching back a silicon oxide film, which is deposited by the CVD, for example, by the RIE (Reactive Ion Etching) method. In other words, the width $d_2$ of the element isolating insulating film 30 in the column direction can be regulated with a treating size requiring no registration allowance in the fabrication process.

The control gate electrode 22 is formed of the second-layer gate electrode material in the fabrication process, such as a polycrystalline silicon film doped with an impurity for reducing the resistance.

Here, the control gate electrode 22 may be formed of a single layer of a refractory metal film or its silicide film, or a composite film prepared by forming a refractory metal silicide film (e.g., $WSi_2$ or $MoSi_2$) over a polycrystalline silicon film.

The control gate electrode 22 is patterned (or multiply cut, as will be called so) to have a predetermined gap $d_3$ and a predetermined width (i.e., a channel length) $d_4$ in a row direction (in the extending direction of the data lines).

Moreover, the width $d_4$ of the control gate electrode 22 is regulated by the treating size requiring no mask registration allowance in the fabrication process.

This control gate 22 is formed integrally with the control gate electrode 22 of the field effect transistor of another memory cell arranged adjacent in the column direction, to constitute the word line WL.

On the other hand, the drain regions of the field effect transistor Q of the memory cell M are regulated by both the channel width $d_1$ or the gap between the element isolating insulating films adjacent to the drain region and the gap $d_3$ between the control gate electrodes.

The control gate electrode 22 is overlain by an insulating film 32 for securing the insulating breakdown voltage from the overlying conductive layer. The floating gate electrode 18 and the control gate electrode 22 have their side walls covered with an insulating film 34 (or a side wall) for securing the insulating breakdown voltage from the overlying conductive layer. The insulating film 34 is formed in self-alignment with the floating gate electrode 18 and the control gate electrode 22. The side wall of the element isolating insulating film 30 has its side walls covered with an insulating film 36 (or a side wall) at the fabrication step shared with the insulating film 34. The insulating film 36 is formed in self-alignment with the element isolating insulating film 30.

These insulating films 34 and 36 are formed by anisotropically etching a silicon oxide film, which is deposited by the CVD, for example, by the RIE or the like.

Reference numeral 37 designates an $n^-$-type semiconductor region which is formed in the principal face of the $p^-$-type well region. The semiconductor region 37 is overlain by a source line (SL) 38.

The field effect transistor Q of the memory cell M has its source region connected with the source line (SL) 38 which is formed of the conductive layer buried between the insulating films 34A. The source lines 38 are connected with the individual source regions of the field effect transistors Q arrayed in the column direction and are extended in the column direction.

The source line 38 is formed by burying tungsten (W) between the insulating films 34 by the selective CVD method, for example.

The source line 38 is formed generally in a plane shared with the control gate electrode 22.

Incidentally, the source line 38 can be formed by selectively growing silicon while being doped with an impurity such as P for reducing the resistance.

Since the source line 38 is thus formed of the conductive layer which is burled between the control gate electrodes 22 (having the gap $d_3$) adjacent to the source line 38, the gap $d_3$ of the control gate electrodes 22 adjacent to the source line 38 can be regulated to the treating size requiring no masking allowance in the fabrication process. As a result, the memory size can be reduced to improve the degree of integration. As will be described hereinafter, moreover, the gap $d_3$ between the control gate electrodes 22 adjacent to the source line 38 can be regulated to the minimum treating size in the fabrication process. Since, moreover, the source line 38 is made of a refractory metal such as tungsten, it is possible to speed up the data writing and reading operations.

The source line 38 and the insulating film 32 are overlain by an inter-layer insulating film 40 for securing the breakdown voltage with the overlying conductive layer.

The field effect transistor Q of the memory cell M has its drain region 24 connected with a data line (DL) 44 through a connection hole 42. The data line 44 is extended in the row direction over the inter-layer insulating film 40. The data line 44 is formed of a refractor metal film, for example. Moreover, the data line 44 may be formed of a polycrystalline silicon film doped with an impurity for reducing the resistance, a refractory metal silicide film, or a composite film (or a pocide) film having a refractory metal silicide film over a polycrystalline silicon film. In short, the data line 44 is formed by the CVD or sputtering method.

Since the data line is thus formed of the conductive layer having an excellent coverage by the CVD or sputtering method, the data line 44 at a stepped portion formed of the connection hole 42 can be prevented from being broken, to improve the electric reliability of the EPROM.

The connection hole 42 is defined by both the insulating film 34, which is formed in self-alignment with the side walls of the floating electrode 22 and the control gate electrode 22 at the connection side with the data line 44, and the insulating film 36 which is formed in self-alignment with the side walls of the element isolating insulating film 30.

The connection hole 42 has its opening area generally defined mainly by the channel width $d_1$, the gap $d_3$ of the control gate electrode 22, and the thicknesses (from the end portion of the drain region) of the insulating films 34 and 36. In the connection hole 42, more specifically, the gaps between the data line 44 and the individual control gate electrodes 22 positioned in the end portion of the connection hole 42 taken in the row direction are equalized. In the connection hole 42, likewise, the gaps between the data line 44 and the individual element isolating insulating films 30 positioned in the end portion of the connection hole 42 taken in the column direction are equalized.

Thus, the data line 44 is connected substantially in self-alignment with the drain region.

The insulating breakdown voltages between the data line 44 and the floating gate electrode 18 and the control gate electrode 22 are secured by the insulating film 32 lying over the control gate electrode 22 and the insulating film 34 lying over the side walls of the former. In other words, the connection hole 42 can be formed without requiring no masking allowance in the fabrication process with respect to the channel width $d_1$ and the gap $d_3$ between the control gate electrodes 22.

Since the data line 44 and the drain region 24 of the field effect transistor Q of the memory cell M can be thus connected without requiring any masking allowance in the fabrication process, the size (or opening area) of the aforementioned drain region 24, which is substantially regulated by the channel width $d_1$ and the gap $d_3$ between the control gate electrodes 22, can be formed to the treating size requiring no registration allowance in the fabrication process.

As a result, the memory size in the row and column directions can be reduced to improve the degree of integration of the EPROM.

In addition to the channel width $d_1$ and the gap $d_3$ between the control gate electrodes 22, moreover, the width $d_2$ of the element isolating insulating film 30 in the column direction and the channel length $d_4$ can be regulated to the treating size requiring no masking allowance in the fabrication process, as has been described hereinbefore. As a result, the memory cell can be formed with the treating size requiring no masking allowance in the fabrication process.

Thus, the degree of integration of the EPROM can be improved.

Moreover, the individual treating sizes of the channel width $d_1$, the width $d_2$ of the element isolating insulating film 30, the gap $d_3$ between the control gate electrodes 22, and the channel length $d_4$ can be minimized in the fabrication process to form the memory cell of the EPROM regulated by the minimum treating size.

The data line 44 is overlain by an inter-layer insulating film 46. The memory cell M thus constructed is overlain by a not-shown wiring layer, which in turn is overlain by a final passivation film.

Next, the process for fabricating the semiconductor integrated circuit device according to the present embodiment will be specifically described with reference to FIGS. 4A to 4M (presenting sections showing an essential portion at individual fabrication steps) and FIGS. 5 and 6 (presenting top plan views showing a memory cell forming region at predetermined fabrication steps).

In each of FIGS. 4A to 4M, the lefthand portions show the region to be formed with the memory cell, and the central and righthand portions show the regions to be formed with peripheral circuits. This memory cell forming portion presents a section taken along line I—I' of FIG. 2 in the vicinity of the peripheral circuit forming regions.

First of all, the p⁻-type semiconductor substrate 10 made of single crystalline silicon is prepared.

Next, the n⁻-type well region 14 is formed over the principal face of the semiconductor substrate 10, as shown in FIG. 4A, in the region to be formed with the p-channel MISFET of the complementary MISFET of the peripheral circuit. The n⁻-type well region 14 can be formed by introducing an n-type impurity such as phosphor (P) of about $10^{13}$ [atoms/cm²] by an ion implantation of an energy of about 120 [KeV].

After this, the p⁻-type well region 12 is formed over the principal face of the semiconductor substrate 10 in the region to be formed with the memory cell and in the region to be formed with the n-channel MISFET of the complementary MISFET of the peripheral circuit. Incidentally, the p⁻-type well region 12 may be formed all over the region of the principal face of the semiconductor substrate 10 different from that of the n⁻-type region 12. After this, a heat treatment of about 1,200° C. is carried out for several hours to effect the extension and the diffusion.

Next, the p⁻-type well region 12 and the n⁻-type well region 14 are formed over their individual principal faces with field insulating films 48 of 400 to 700 [nm]. These field insulating films 48 are formed of a silicon oxide film by oxidizing the individual principal faces of the p⁻-type well region 12 and the n⁻-type well region 14 selectively. At the fabrication step substantially identical to that for forming that field insulating film 48, a p-channel stopper region 50 is formed below the field insulating film 48 over the principal face of the semiconductor substrate 10. The channel stopper region 50 can be formed by introducing BF₂ of about $10^{13}$ [atoms/cm²] in advance into the principal face of the p⁻-type well region 12 of the field insulating film forming region by an ion implantation of an energy of about 60 [KeV] and by extending and diffusing the impurity by the heat treatment for forming the field insulating film 48. The memory cell forming region and the peripheral circuit forming region are electrically isolated by those field insulating film 48 and channel stopper region 50. Moreover, the peripheral circuit forming region is formed with the field insulating film 48 and the channel stopper region 50 between the element forming regions.

Next, the p⁻-type well region 12 and the n⁻-type well region 14 are formed over their respective principal faces with the gate insulating films 16 of about 15 to 20 [nm]. The gate insulating films 16 are formed of silicon oxide films by oxidizing the respective principal faces of the p⁻-type well region 12 and the n⁻-type well region 14.

Figure 4K:
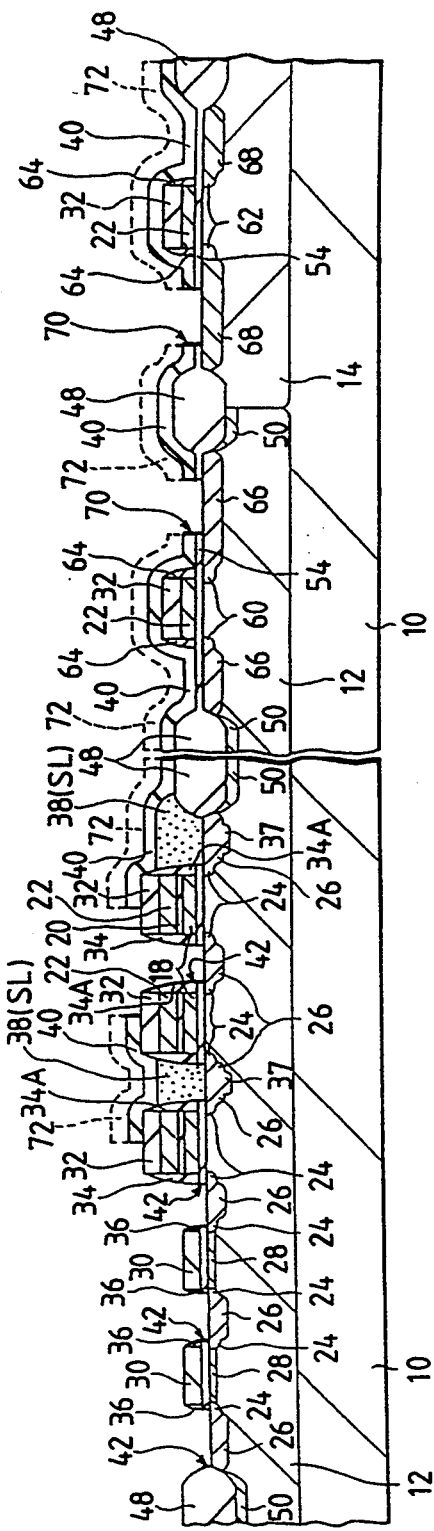
Figure 4L:
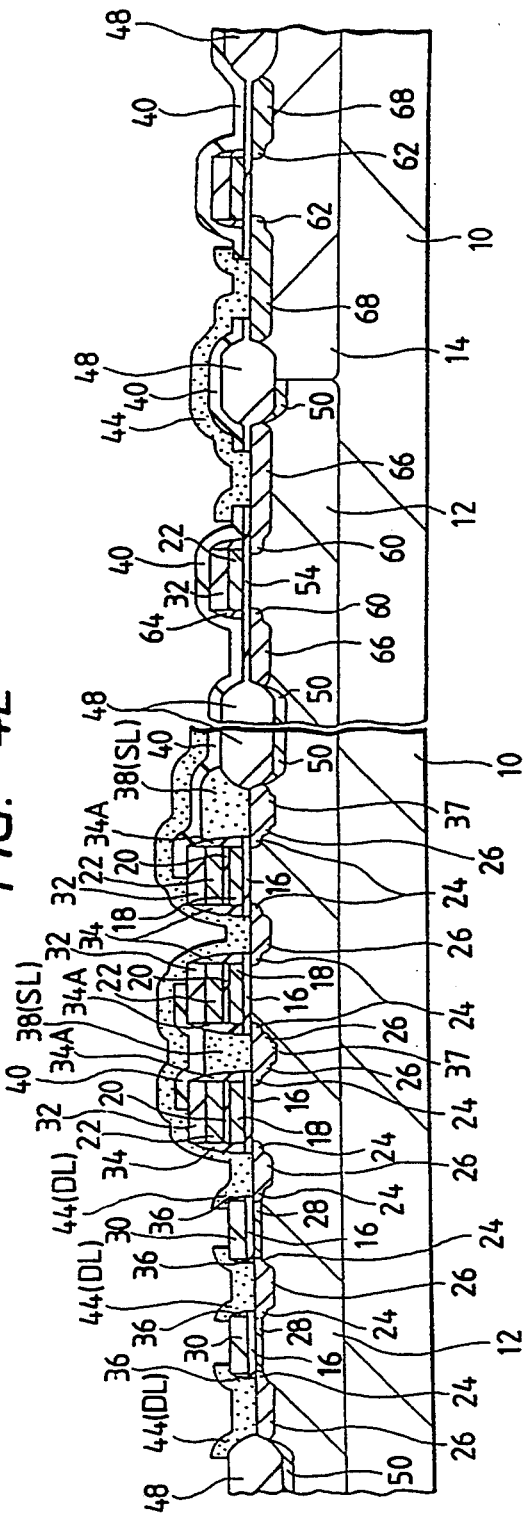
Figure 5:
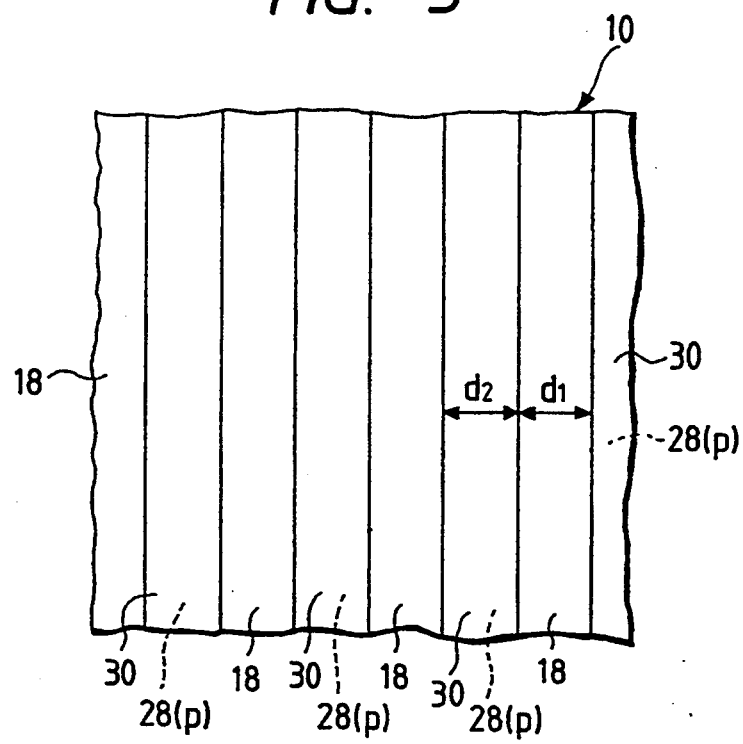
FIGS. 5 and 6 are top plan views showing the memory cell array of the EPROM according to the Embodiment I of the present invention at predetermined fabrication steps.

Next, as shown in FIGS. 4B and 5, the first-layer gate electrode layer 18 is deposited all over the substrate including the gate insulating film 16. The first-layer gate electrode layer 18 is formed of a polycrystalline silicon film having a thickness of 200 to 300 [nm], for example, by depositing it by the CVD. This polycrystalline silicon film is doped after the deposition with an n-type impurity such as P for reducing the resistance (by the ion implantation or the thermal diffusion).

Next, the first-layer gate electrode layer 18 having the predetermined width (or the channel width) $d_1$ and the predetermined gap $d_2$ in the row direction is formed by patterning the first-layer gate electrode layer 18 with a predetermined shape.

This patterning can be carried out by an anisotropic etching such as the RIE using a photo resist 52 as the mask.

Incidentally, the aforementioned gap $d_2$ may be reduced to the minimum treating size in the fabrication process.

In this etching, moreover, the first-layer gate electrode layer 18 over the peripheral circuit forming region may be left unetched.

Next, in the memory cell forming region, the principal face of the semiconductor substrate 10 between the first-layer gate electrode layers 18 is formed with the p-type channel stopper region 28. This p-type channel stopper region 28 is formed by introducing a p-type impurity such as $BF_2$ of about $10^{13}$ [atoms/cm²] by an ion implantation of an energy of about 60 [KeV] using the aforementioned photo resist 52, for example, as the mask.

Incidentally, after this step, the p-type impurity may be extended and diffused by a heat treatment (e.g., an annealing).

Next, after removal of the photo resist 52, the insulating film 30 is formed all over the substrate including the first-layer gate electrode layer 18, as shown in FIG. 4C. The insulating film 30 is so formed of a silicon oxide film having a thickness equal to or more than one half of the gap $d_2$ between the first-layer gate electrodes 16 by using the CVD, for example, that it bury the clearance between the first-layer gate electrode layers 16.

After this, as shown in FIG. 4D and 5, the insulating film 30 is buried and formed in the memory cell forming region between the aforementioned first-layer gate electrode layers 18.

The insulating film 30 is buried between the first-layer gate electrode layers 18 substantially coextensively with the surface of the first-layer gate electrode layers 18 by etching back the insulating film 30 using the RIE, for example. Thus, the insulating film 30 and the p-channel stopper region 28 are buried and formed in self-alignment between the first-layer gate electrode layers 18 patterned to have the predetermined gap $d_2$ in the column direction.

In other words, the width $d_2$ of the insulating film 30 in the column direction can be regulated to the treating size requiring no masking allowance in the fabrication process.

Since, moreover, the insulating film 30 is formed substantially coextensively with the surface of the first-layer gate electrode layer 18, the insulating film 30 and the first-layer gate electrode 16 can be formed to have substantially flat surfaces.

Next, as shown in FIG. 4E, the insulating film 20 is formed all over the substrate including the first-layer gate electrode layer 16 and the insulating film 30.

This insulating film 20 is formed, for example, of a silicon oxide film having a thickness of about 2 to 5 [nm] prepared by oxidizing the individual surfaces of the first-layer gate electrode layer 18 and the insulating film 30, a silicon nitride film having a thickness of about 10 to 20 [nm] deposited over the silicon oxide film by the CVD, for example, and a silicon oxide film having a thickness of about 2 to 5 [nm] prepared by oxidizing the surface of the silicon nitride film. In other words, the insulating film 20 is formed to have a three-layered insulating film structure and the ONO structure.

Moreover, the insulating film 20 may be formed of a single layer of a silicon oxide film or a silicon nitride film, or their composite film (or two-layered film).

Next, as shown in FIG. 4F, in the peripheral circuit forming region, the aforementioned insulating film 20, first-layer gate electrode layer 18 and gate insulating film 16 are individually etched off in a sequential manner to expose the surface of the semi-conductor substrate 10 to the outside. This etching can be carried out by using an anisotropic etching such as the RIE.

Although not shown, on the other hand, in the course of the etching step, the memory cell forming region is covered with a passivation film such as a photo resist film.

Next, as shown in FIG. 4G, in the peripheral circuit forming region, the p⁻-type well region 12 and the n⁻-type well region 14 are formed over their individual principal faces with a gate insulating film 54 having a thickness of about 15 to 20 [nm]. This gate insulating film 54 is formed of a silicon oxide film by oxidizing the individual principal faces of the p⁻-type well region 12 and the n⁻-type well region 14.

After this, the second-layer gate electrode layer 22 is deposited over the gate insulating film 54 of the peripheral circuit forming region and the insulating film 20 of the memory cell forming region.

This second-layer gate electrode layer 22 is formed of a polycrystalline silicon film having a thickness of 200 to 300 [nm] deposited by the CVD, for example. This polycrystalline silicon film is doped after the deposition with an n-type impurity such as P for reducing the resistance (by the ion implantation or the thermal diffusion).

Incidentally, the second-layered gate electrode layer 22 may be formed of a composite film, as called the "polycide film", which is composed of a polycrystalline silicon film having a thickness of 100 to 150 [nm] and a WSi film having a thickness of 150 to 200 [nm].

This WSi film can be formed by the CVD or the sputtering.

After this, the second-layer gate electrode layer 22 is overlain by the insulating film 32. This insulating film 32 is formed by a silicon oxide film having a thickness of 400 to 500 [nm] deposited by the CVD, for example. Incidentally, the insulating film 32 may be formed of a composite film deposited by the CVD and composed of a silicon oxide film and a silicon nitride film.

The insulating film 20, the second-layer gate electrode layer 22 and the insulating film 32 are individually formed in a sequential manner over the surfaces of the insulating film 30 and the first-layer gate electrode layer 18, which are substantially flattened into a coextensive face, so that their individual surfaces can be substantially flattened.

Figure 6:
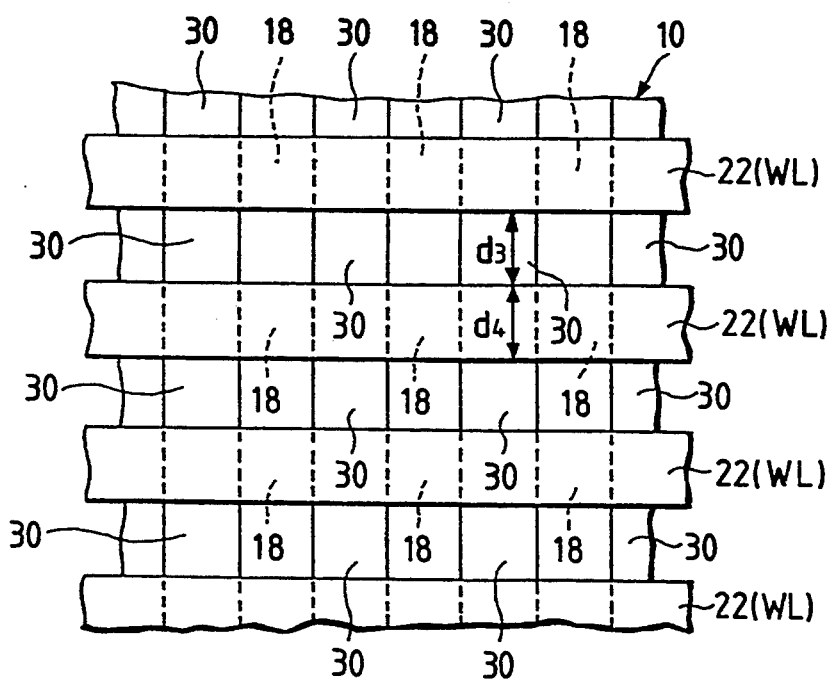

Next, as shown in FIG. 4H and 6, the insulating film 32 in the memory cell forming region is subjected to a first patterning.

In this patterning, the insulating film 32 is patterned, and the second-layer gate electrode layer 22, the insulating film 20 and the first-layer gate electrode layer 18 are sequentially patterned (or multiply cut) by using the common mask.

Moreover, this patterning leaves the insulating film 30. This patterning can be carried out to the treating size requiring no masking allowance in the fabrication process.

This patterning can form not only the control Kate electrode 22 having the predetermined gap $d_3$ in the row direction and the predetermined width (or the channel length) $d_4$ but also the floating gate electrode 18 and the control gate electrode 22 of the field effect transistor Q individually.

The aforementioned patterning is carried out by an anisotropic etching such as the RIE using a photo resist 53 as the mask, for example.

Incidentally, the etchings of the insulating film 32 and the insulating film 20 can be carried out by using gases of $CHF_3$ or $CF_4+H_2$.

On the other hand, the etchings of the first- and second-layer gate electrode layers 18 and 22 can be carried out by using gases of $C_2Cl_3F_3+SF_6$. If, in these etchings, the selection ratio of the first-layer gate electrode layer 18 formed of the polycrystalline silicon film to the insulating film 30 formed of the silicon oxide film is set to 20 or more, the insulating film 30 can be substantially left while selectively etching the first-layer gate electrode layer 18 only.

Since, moreover, the insulating film 32 is formed to have its surface substantially flattened, it is possible to improve the accuracy of the aforementioned patterning.

After this, in the memory cell forming region, the $p^-$-type well region 12 has its principal face formed with the $n^-$-type semiconductor region 24. This semiconductor region 24 can be formed by introducing an n-type impurity such as As of about $10^{15}$ [atoms/cm$^2$] by an ion implantation of an energy of about 60 [KeV] using the aforementioned photo resist as the mask. The semiconductor region 24 is formed in self-alignment with the floating gate electrode 18, the control gate electrode 22 and the insulating film 32, respectively, and is regulated by the channel width $d_1$ and the gap $d_3$ between the control gate electrodes 22.

Incidentally, after the semiconductor region 24 has been formed, the whole face of the substrate may be subjected to a heat treatment to form a thin oxide film on the side walls of the floating gate electrode 18, the control gate electrode 22 and the insulating film 32.

Next, as shown in FIG. 4I, in the peripheral circuit forming region, the aforementioned insulating layer 32 is subjected to a second patterning.

Then, the insulating film 32 and the second-layer gate electrode layer 22 are sequentially patterned.

By this patterning, it is possible to form the individual gate electrodes 22 and insulating films 32 of the p-channel MISFET and the n-channel MISFET.

In other words, the gate electrode 22 of the MISFET of the peripheral circuit forming region is formed of the material of the second-layer gate electrode.

This patterning can be carried out by an anisotropic etching such as the RIE using a not-shown photo resist as the mask.

After this, in the peripheral circuit forming region, the $p^-$-type well region 12 is formed over its principal face with an $n^-$-type semiconductor region 60.

This semiconductor region 60 can be formed by introducing P of about $10^{13}$ [atom/cm$^2$], for example, by an ion implantation of an energy of about 40 to 80 [KEV]. The semiconductor region 60 is formed in self-alignment with each gate electrode 22.

Next, in the peripheral circuit forming region, the $n^-$-type well region 14 is formed over its principal face with a $p^-$-type semiconductor region 62.

This semiconductor region 62 can be formed by introducing $BF_2$ of about $10^{13}$ [atoms/cm$^2$], for example, by an ion implantation of an energy of about 40 to 80 [KEV]. The semiconductor region 62 is formed in self-alignment with each gate electrode 22.

Next, as shown in FIG. 4J, in the memory cell forming region and the peripheral circuit forming region: the floating gate electrode 18 and the control gate electrode 22 and the insulating film 30 have their individual side walls covered with an insulating film 34A (or a side wall spacer); the insulating film 30 has its side walls covered with an insulating film 36A (or a side wall spacer); and the gate electrode 22 has its side walls covered with an insulating film 64 (or a side wall spacer).

These insulating films 34A, 36A and 64 can be formed by anisotropically etching by the RIE or the like the silicon oxide film which is deposited to have a thickness of about 300 [nm] by the CVD all over the substrate including the insulating film 32, for example.

Thus, the insulating film 34A is formed in self-alignment with the floating gate electrode 18, the control gate electrode 22 and the insulating film 32, Moreover, the insulating film 36A is formed in self-alignment with the insulating film 30.

Next, the substrate including the $p^-$-type well region 12 and the $n^-$-type well region 14 is all over its surface with an silicon oxide film of about 10 [nm], which is deposited by the CVD. After this, in the memory cell forming region and each peripheral circuit forming region, the $p^-$-type well region 12 is formed over its principal face with $n^-$-type semiconductor regions 26 and These semiconductor regions 26 and 66 can be formed by introducing As of about $10^{15-16}$ [atoms/cm$^2$], for example, by an ion implantation of an energy of about 50 [KeV]. The semiconductor region 26 is formed in self-alignment with each control gate electrode 22 and each insulating film 34A. Moreover, the semiconductor region 66 is formed in self-alignment with each gate electrode 22 and each insulating film 64.

After this, in the peripheral circuit forming region, the $n^-$-type well region 14 has its principal face formed with a $p^+$-type semiconductor region 68.

This semiconductor region 68 can be formed by introducing $BF_2$ of about $10^{15}$ [atoms/cm$^2$], for example, by an ion implantation of an energy of about 50 [KeV]. The semiconductor region 68 is formed in self-alignment with each gate electrode 22 and each insulating film 64.

As a result, in the peripheral circuit forming region, the n-channel MISFET and the p-channel MISFET are individually completed to have the LDD structure.

Next, in the memory cell forming region, as shown in FIG. 4K, the p⁻-type well region 12 has its principal face formed with the n-type semiconductor region 37 in its source line forming region.

This semiconductor region 37 can be formed by introducing P of about $10^{14-15}$ [atoms/cm²], for example, by an ion implantation of an energy of about 150 [KEV].

The semiconductor region 37 is formed in self-alignment with the control gate electrode 22 and the insulating films 32 and 34A.

After this, in the memory cell forming region, the principal face of the p⁻-type well region 12 has the insulating film 30 etched off from its source line forming region to expose the surface of the semiconductor substrate 10 to the outside.

By this etching, moreover, the element isolating insulating film 30 is formed in the memory cell forming region.

This element isolating insulating film 30 is so formed in self-alignment with the floating gate electrode 22 as to have the width $d_2$ in the column direction.

The element isolating insulating film 30 is also formed in self-alignment with the source line forming region in the row direction.

The aforementioned etching can be carried out by an anisotropic etching such as the RIE using the aforementioned photo resist as the mask, for example.

Next, in the memory cell forming region, the principal face of the p⁻-type well region 12 is formed with the source line 38 over its source line forming region.

This source line 38 can be selectively formed over the principal face of the aforementioned p⁻-type well region between the insulating films 34A by using a selective CVD of tungsten, for example.

In other words, the source line 38 can be substantially buried between the control gate electrodes 22 (having the gap $d_3$).

Thus, the source line 38 can be formed without requiring the masking allowance in the fabrication process.

Next, in the memory cell forming region and the peripheral circuit forming region, the substrate is formed all over its surface with the Insulating film 40.

This insulating film 40 can be formed of the silicon oxide film which is deposited by the CVD, for example, to have a thickness of about 100 [nm].

Next, in the memory cell forming region and the peripheral circuit forming region, the insulating film 40 is etched to form a connection hole 70.

These inter-layer insulating film 40 and the connection hole 70 can be formed by the anisotropic etching such as the RIE using a photo resist 72 as the mask, for example.

By this etching, moreover, in the memory cell region left uncovered with the photo resist 72, the drain regions 24 and 26 of the field effect transistor Q of the memory cell are formed with the connection hole 42, and the insulating films 34 and 36 are individually formed in self-alignment with the insulating films 34A and 36A.

Moreover, the insulating film 34 is formed only over one side wall of the control gate electrode 22.

Here, the insulating film 34 is formed in self-alignment with the side walls of the floating gate electrode 18, the control gate electrode 22 and the insulating film 32. At the same time, the insulating film 36 is formed in self-alignment with the side walls of the element isolating insulating film 30.

Moreover, the connection hole 42 is defined by both the insulating film 34, which is formed in self-alignment with the side walls of the floating gate electrode 18, the control gate electrode 22 and the insulating film 32, and the insulating film 36 which is formed in self-alignment with the side walls of the element isolating insulating film 30.

In the aforementioned drain regions 24 and 26, moreover, there can be formed the connection hole 42 which has such an opening area as is defined by the gap $d_3$ of the control gate electrodes 22 and the thicknesses (from the end portions of the drain regions) of the insulating films 34 and 36.

Thus, at the connections between the drain regions 24 and 26 of the field effect transistor Q of the memory cell and the later-described data lines, the connection holes 42 can be formed in self-alignment with the side walls of the floating gate electrode 18, the control gate electrode 22 and the insulating film 32 by forming the insulating film 32 over the control gate electrode 22, by forming the insulating film covering all over the surface, by forming the insulating films 34 and 36 by the anisotropic etching such as the RIE of the insulating films at the connections, and by defining the connection holes 42 by the insulating films 34 and 36.

In other words, the drain regions 24 and 26 of the field effect transistor Q of the memory cell and the data lines can be connected without requiring the masking allowance in the fabrication process, and the sizes (or the opening areas) of the drain regions 24 and 26, which are substantially regulated by both the channel width $d_1$ and the gap $d_3$ between the control gate electrodes 22, can be formed with the treating size requiring no registration allowance.

As a result, it is possible to reduce the memory cell size of the EPROM in the row and column directions thereby to improve the degree of integration of the EPROM.

After the photo resist 72 has been removed, each of the memory cell forming region and the peripheral circuit forming region is formed with the wiring layer 44, as shown in FIG. 4M.

This wiring layer 44 is used as the data lines 44 in the memory cell forming region.

The wiring layer 44 can be formed by laminating, a titanium nitride (TIN) film and a tungsten silicide (WSi₂) film sequentially by the sputtering method, for example, and by patterning these films sequentially.

The tungsten silicide film and the titanium nitride film, which is formed between the n⁺-type semiconductor region 66 and the p-type semiconductor region 68, are formed as barrier metal layers for preventing the impurities of those semiconductor regions 66 and 68 from diffusing to each other through the tungsten silicide film. As a result, the mutual diffusion of the impurities can be prevented to improve the reliability of the semiconductor integrated circuit device.

Incidentally, the wiring layer 44 may be formed of a polycrystalline silicon film doped with an impurity for reducing the resistance, a refractory metal film such as tungsten (W), or a polycide film having a refractory metal silicide (e.g., WSi) film formed over a polycrystalline silicon film.

In other words, the wiring layer 44 can be formed by the CVD or the sputtering method.

Next, in each of the memory cell forming region and the peripheral circuit forming region, the inter-layer insulating film 46 and a connection hole 74 of a BPSG (Boron-doped Phospho-Silicate Glass) film are sequentially formed all over the face of the substrate. The inter-layer insulating film 46 can be formed by depositing it by the CVD, for example.

After this, the inter-layer-insulating film 46 is subjected to a graph flow to have its surface flattened.

Next, a wiring layer 76 is so formed over the inter-layer insulating film 46 to contact with the surface of the wiring layer 44 through the aforementioned connection hole 74.

This wiring layer 76 is formed to connect the data line 44 in the memory cell forming region and the wiring layer 44 in the peripheral circuit forming region. The wiring layer 76 can be formed, for example, by subjecting either an aluminum film deposited by the sputtering method or an aluminum alloy doped with a predetermined additive (e.g., Si and/or Cu) to a predetermined patterning.

After this, the substrate is formed all over its surface with a (not-shown) final passivation film to complete the semiconductor integrated circuit device of the present Embodiment I.

In the present Embodiment I, the gap between the control gate electrodes adjacent to the source line 38 and the gap between the control gate electrodes adjacent to the drain regions 24 and 26 are made equal. Despite of this fact, however, the gaps should not be limited to the equal relation but may be made different.

[Embodiment II]

The present Embodiment II is modified from the semiconductor integrated circuit device of the foregoing Embodiment I into a second embodiment, in which the data lines are connected with the drain region of the field effect transistor of the memory cell through drain contact pads which are buried in self-alignment with the aforementioned drain region.

Figure 7:
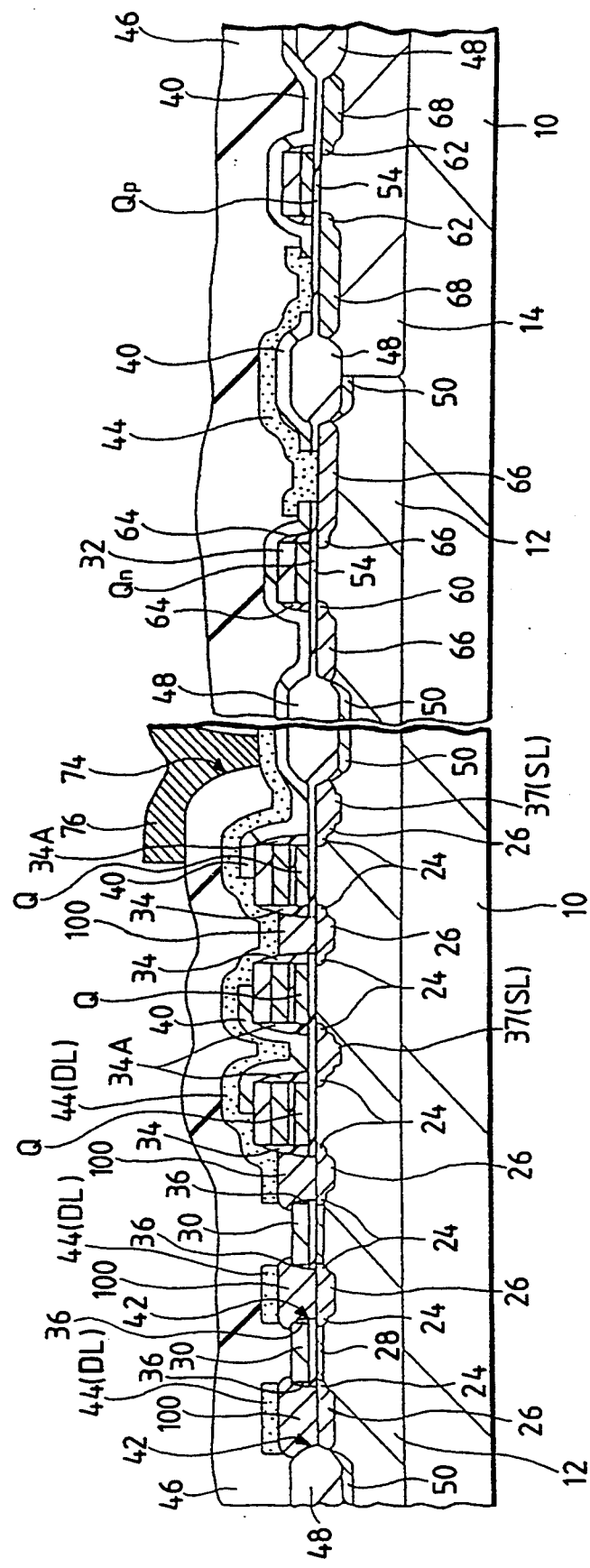
FIG. 7 is a section showing an essential portion of a semiconductor integrated circuit device according to Embodiment II of the present invention.

The semiconductor integrated circuit device according to the Embodiment II of the present invention is shown in FIG. 7 (presenting a section showing an essential portion of the semiconductor integrated circuit).

In FIG. 7, reference numeral 100 designates a drain contact pad which is buried in each connection hole 42 in the drain regions 24 and 26. Numeral 44 designates a wiring layer which is used as the data line 44 in the memory cell forming region.

The data line 44 is electrically connected through the drain contact pad 100 with each of the drain regions 24 and 26.

The drain contact pat 100 is formed of a single crystalline silicon film having a thickness of about 400 [nm], for example.

This drain contact pad can be buried in the connection hole 42 by using the selective growth of single crystalline silicon, for example.

Moreover, the thickness of the aforementioned single crystalline silicon film is so set that the single crystalline silicon films adjoining in the column direction may not come into contact even after they have grown in the column direction.

Incidentally, the source line in the present Embodiment is formed of an n+-type semiconductor region 37A which in turn is formed over the principal face of the p⁻-type well region 12.

Next, the process for fabricating the semiconductor integrated circuit device thus constructed will be briefly described with reference to FIGS. 8A and 8B (presenting sections showing an essential portion at individual fabrication steps).

After having passed through the steps shown in FIGS. 4A to 4J, in the memory cell forming region, the source line forming region of the p⁻-type well region is formed with the n+-type semiconductor region 37A, as shown in FIG. 8A, by a fabrication process similar to that of the aforementioned Embodiment I.

This semiconductor region 37A can be formed by introducing P of about $10^{14-16}$ [atoms/cm$^2$] by an ion implantation of an energy of about 150 [KeV] using a photo resist as the mask, for example.

As a result, the semiconductor region 37A is formed in self-alignment with the control gate electrode 22 and the insulating films 32 and 34A.

Next, in the memory cell forming region, the insulating film 16 is removed from the drain regions 24 and 26 of the field effect transistor Q of the memory cell by the anisotropic etching such as the RIE to expose the surface of the semiconductor substrate 10 to the outside.

By this etching, moreover, the connection hole 42 is also formed in the drain regions 24 and 26 of the field effect transistor Q of the memory cell.

This connection hole 42 is defined by the insulating films 34A and 36A.

After this, in the memory cell forming region, the drain region is formed thereover with the drain contact pad 100. This drain contact pad 100 can be substantially buried in the connection hole 42 by selectively depositing single crystalline silicon on the drain region, through which the surface of the semiconductor substrate 10 is exposed, by the use of the selective growth of the single crystalline silicon, for example, while being doped with an impurity such as P for reducing the resistance.

Next, as shown in FIG. 8B, the insulating film 40 is formed all over the face of the substrate including the memory cell forming region and the peripheral circuit forming region.

The insulating film 40 can be formed by anisotropically etching by the RIE or the like the silicon oxide film of about 100 [nm], which is deposited by the CVD, for example, by using a photo resist as the mask.

By this etching, the connection hole 70 is also formed in the peripheral circuit forming region.

Next, like the foregoing Embodiment I, the wiring layer 44 is formed in each of the memory cell forming region and the peripheral circuit forming region.

As a result, the data line 44 and the drain regions 24 and 26 of the field effect transistor Q can be connected without requiring the masking allowance in the fabrication process.

Next, like the Embodiment I, the inter-layer insulating film 46, the connection hole 74 and the wiring layer 76 are sequentially formed in each of the memory cell forming region and the peripheral circuit forming region, to complete the semiconductor integrated circuit, as shown in FIG. 7.

The semiconductor integrated circuit device thus constructed can achieve the following effects in addition to those of the foregoing Embodiment I.

The step to be formed by the connection hole 42 in the row direction can be reduced by connecting the drain regions 24 and 26 of the field effect transistor Q of the memory cell and the data line 44 through the drain contact pad 100 which is buried in self-alignment with the connection hole 42.

As a result, the data line 44 at the aforementioned step can be prevented from being broken, to improve the electric reliability of the semiconductor integrated circuit device.

[Embodiment III]

The present Embodiment III is modified from the semiconductor integrated circuit device of the foregoing Embodiment I into a third embodiment, in which the data line is connected with the drain region of the field effect transistor of the memory cell through a pad electrode which is formed in self-alignment with the drain region.

Figure 9:
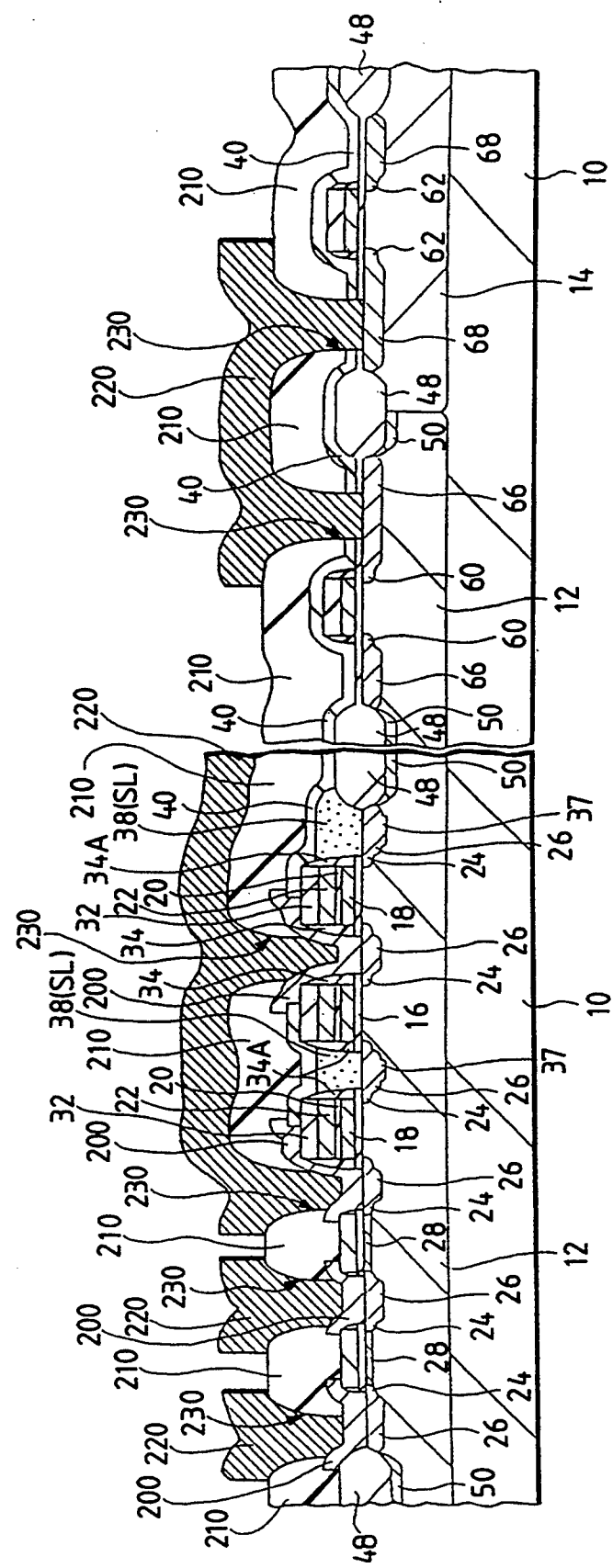
FIG. 9 is a section showing an essential portion of the semiconductor integrated circuit device 1 according to Embodiment III of the present invention.

A semiconductor integrated circuit device according to the Embodiment III of the present invention is shown in FIG. 9 (presenting a section showing an essential portion of the semiconductor integrated circuit device).

In FIG. 9, reference numeral 200 designates a pad electrode which is formed in self-alignment with the drain regions 24 and 25. Numeral 210 designates an inter-layer insulating film, and numeral 220 designates a wiring layer. This wiring layer 220 is used as the data line in the memory cell forming region and is electrically connected with the drain regions 24 and 26 through the pad electrode 200.

This pad electrode 200 can be formed by doping a polycrystalline silicon film deposited by the CVD, for example, with an impurity for reducing the resistance and subsequently by subjecting the film to a predetermined patterning.

On the other hand, the pad electrode 200 may be formed of a refractory metal (e.g., W) film deposited by the CVD or the sputtering, a refractory silicide film (e.g., $WSi_2$), or a polycide film having a refractory silicide film over a polycrystalline silicon film.

The wiring layer 220 is formed, for example, of either an aluminum film deposited by the sputtering or an aluminum alloy to which Si or Cu is added.

Next, the process for fabricating the semiconductor integrated circuit device thus constructed will be briefly described with reference to FIGS. 10A and 10B (presenting sections showing an essential portion at the individual fabrication steps).

The fabrication process is similar to that of the foregoing Embodiment I and takes the steps shown in FIGS. 4A to 4J. After this, like the Embodiment I, the n-type semiconductor region 37, the source line 38, the insulating film 40, the inter-layer insulating film 40 and the connection hole 42 are sequentially formed, as shown in FIG. 10A.

Next, as shown in FIG. 10B, the pad electrode 200 is formed through the connection hole 42 in the memory cell forming region.

The pad electrode 200 can be formed in each of the memory cell forming region and the peripheral circuit forming region by depositing a polycrystalline silicon film all over the surface of the substrate by the CVD, by doping the polycrystalline silicon film with an impurity for reducing the resistance by the ion implantation or the like, and subsequently by anisotropically etching the polycrystalline silicon film by the RIE or the like.

As a result, the pad electrode 200 can be formed in self-alignment with the drain regions 24 and 26.

Incidentally, since the gap between the pad electrodes 200 in the column direction is required to have at least the minimum treating size in the fabrication process, the width $d_2$ of the element isolating insulating film 30 in the column direction is made wider than the minimum treating size.

After this, in each of the memory cell forming region and the peripheral circuit forming region, the substrate is formed all over its surface with the inter-layer insulating film 210 and the connection hole 230 sequentially. The inter-layer insulating film 210 can be formed of a BPSG film deposited by the CVD, for example.

After this, the inter-layer insulating film 210 is subjected to the glass flow to have its surface flattened.

Next, the wiring layer 220 is so formed over the inter-layer insulating film 210 as to contact with the surface of the pad electrode 200 through the aforementioned connection hole 230, to complete the semiconductor integrated circuit device shown in FIG. 9.

The semiconductor integrated circuit device thus constructed can achieve the following effects in addition to those of the foregoing Embodiment I.

At the time of connecting the drain regions 24 and 26 of the field effect transistor Q of the memory cell and the data line 44, the data line 44 is connected with the drain regions 24 and 26, which are formed to the treating size requiring no masking allowance in the fabrication process, through the pad electrode which is formed in self-alignment with the drain regions 24 and 26.

As a result, it is possible to reduce the masking allowance at the time of connecting the data line 220 and the drain regions 24 and 26.

Since, moreover, the data line 220 is formed of a material which is composed mainly of aluminum having a low resistance, it is possible to speed up the data writing and reading operations. As a result, the writing/reading characteristics of the semiconductor integrated circuit device can be improved.

[Embodiment IV]

The present Embodiment IV is a fourth embodiment, in which the present invention is applied to a flash type $E^2PROM$.

The aforementioned flash type $E^2PROM$ is exemplified in Japanese Patent Application No. 63-284587.

Figure 11:
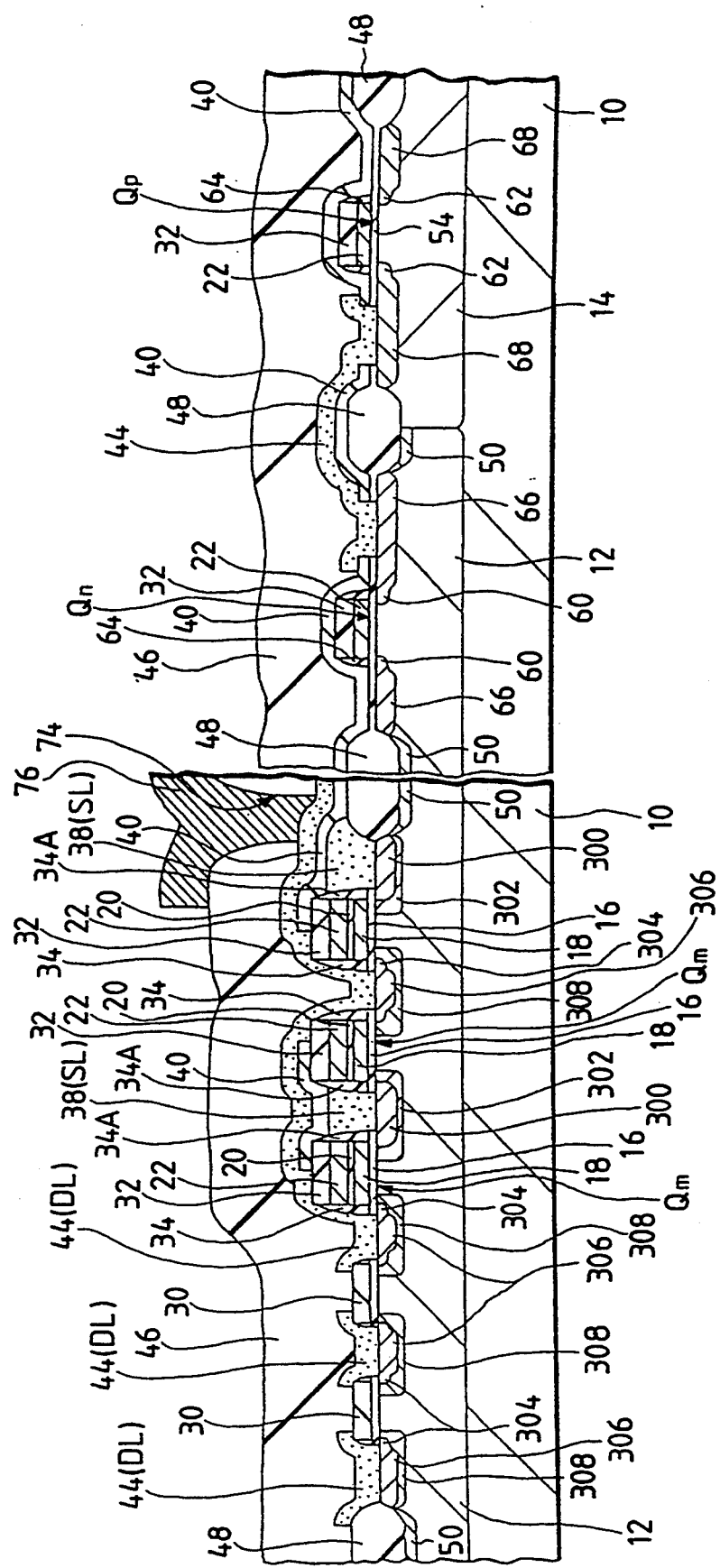
FIG. 11 is a section showing an essential portion of a flash type E$^2$PROM according Embodiment IV of the present invention.

The structure of the flash type $E^2PROM$ according to the Embodiment IV of the present invention is shown in FIG. 11 (presenting a section showing an essential portion including individual elements).

In FIG. 11, the lefthand side shows the memory cell forming region, and the central and right-hand sides show the individual peripheral circuit forming regions.

The memory cell of the flash type $E^2PROM$ is composed of field effect transistors Qm, which are substantially different from the field effect transistors of the memory cell of the aforementioned Embodiment I only in the structure of the semiconductor region providing the source region and the drain region.

The memory cell is composed, as shown in FIG. 11, of the $p^-$-type well region 12, the gate insulating insulating film 16, the floating gate electrode 18, the inter-layer insulating film 20, the control gate electrode 22, a heavily doped $n^+$-type semiconductor region 300 and a lightly doped n-type semiconductor region 302 for providing the source region, and a lightly doped n-type semiconductor region 304 and a heavily doped $n^+$-type semiconductor region 306 for providing the drain region.

The aforementioned p-type well region 12 is used as the channel forming region.

The n-type semiconductor region 302 is formed along the outer periphery of the $n^+$-type semiconductor region 300. In other words, the source region is constructed to have the so-called "double-diffused structure". The aforementioned source region has its dopage increased by the $n^+$-type semiconductor region 300 so that its surface may not be depleted in case a high voltage is applied between the source region and the control gate electrode when in the data erasure.

The $n^+$-type semiconductor region 300 and the n-type semiconductor region 302 are formed in self-alignment with the floating gate electrode 18, the control gate electrode 22 and the insulating film 32.

The n-type semiconductor region 304 of the drain region has such a lower dopage and a shallower junction depth than the $n^+$-type semiconductor region 300 of the aforementioned source region that the hot electrons may be sufficiently generated when in the writing operation.

The n-type semiconductor region 304 is formed in self-alignment with the floating gate electrode 18, the control gate electrode 22 and the insulating film 32.

The $n^+$-type semiconductor region 306 is formed in self-alignment with both the insulating film 34, which in turn is formed in self-alignment with the floating gate electrode 18, the control gate electrode 22 and the insulating film 32, and the insulating film which in turn is formed in self-alignment with the element isolating Insulating film 30.

The principal face of the semiconductor substrate 10 extending along the outer periphery of the aforementioned drain region is formed with a heavily doped $p^+$-type semiconductor region 308. The $p^+$-type semiconductor region 308 is constructed to enhance the intensity of the electric field in the vicinity of the drain region and to promote the generation of the hot electrons in the electric field transistor Qm, which is selected when in the data writing operation, thereby to improve the data writing efficiency.

The aforementioned source region and drain region can be formed by a process substantially identical to the fabrication process of the aforementioned Japanese Patent Application No. 63-284587.

The process for fabricating the flash type E²FROM of the present Embodiment will be briefly described in the following. Like the foregoing Embodiment, the insulating film 32 is subjected in the memory cell forming region to a first patterning (or multiply cut), and the semiconductor regions 300 and 302 are sequentially formed in the source region of the memory cell by using a photo resist as the mask, for example.

The $n^+$-type semiconductor region 302 can be formed by introducing P ions in a doping concentration of about $1 \times 10^{14}$ to $1 \times 10^{15}$ [atoms/cm²], for example, by an ion implantation of an energy of about 50 [KeV].

Moreover, the n-type semiconductor region 300 can be formed by introducing As ions in a doping concentration of about $5 \times 10^{15}$ to $1 \times 10^{16}$ [atoms/cm²], for example, by an ion implantation of an energy of about 60 [KeV].

After this, the aforementioned photo resist is removed.

Next, the $p^+$-type semiconductor region 308 is formed in the drain region of the memory cell by using a photo resist as the mask, for example.

The $p^+$-type semiconductor region 308 can be formed by introducing $BF_2$ ions in a doping concentration of about $5 \times 10^{13}$ to $1.5 \times 10^{14}$ [atom/cm²], for example, by an ion implantation of an energy of about 60 [KeV]. After this, the aforementioned photo resist is removed.

Next, a heat treatment is carried out to extend and diffuse the semiconductor regions 300, 302 and 308.

Next, the principal face of the $p^+$-type semiconductor region 308 is formed with the n-type semiconductor region 304 by using a photo resist as the mask, for example.

The n-type semiconductor region 304 can be formed by introducing As ions in a doping concentration of about $5 \times 10^{14}$ to $3 \times 10^{15}$ [atoms/cm²], for example, by an ion implantation of an energy of about 60 [KeV].

After this, the aforementioned photo resist is removed.

Next, like the aforementioned Embodiment I, in the peripheral circuit forming region, the insulating film 32 is subjected to a second patterning, and the $n^-$-type semiconductor region 60, the $p^-$-type semiconductor region 62, the insulating films (or the side wall spacers) 34A, 35A and 64, the $n^+$-type semiconductor regions 66 and 306 and the $p^+$-type semiconductor region 68 are then sequentially formed.

The $n^+$-type semiconductor regions 306 and 66 can be formed by introducing As in a doping concentration of about $10^{15-16}$ [atoms/cm²] by an ion implantation of an energy of about 60 [KeV] using a photo resist as the mask, for example.

Next, like the foregoing Embodiment I, the source line 38, the inter-layer insulating film 40, the insulating films 34 and 36, the wiring layer 44, the inter-layer insulating film 46 and the wiring layer 76 are sequentially formed to complete the flash type E²PROM, as shown in FIG. 11.

The flash type E²PROM thus constructed can achieve effects similar to those of the foregoing Embodiment I.

Incidentally, in the present Embodiment, after the $n^+$-type semiconductor regions 306 and 66 have been formed, the n-type semiconductor region 37 may be formed in the source line forming region of the memory cell like the foregoing Embodiment I.

Although our invention has been specifically described in connection with the foregoing Embodiments, it should not be limited thereto but can naturally be modified in various manners within the scope of the gist thereof.

In the Embodiment I, for example, the $n^+$-type semiconductor region 26 acting as the source/drain regions of the field effect transistor Q of the memory cell is formed in self-alignment with each of the insulating films 34A and 36A. Despite of this fact, however, the aforementioned $n^+$-type semiconductor region 26 need not be formed in the memory cell forming region but may be substituted by both the n-type semiconductor region 37 and the $n^+$-type semiconductor region which is formed by introducing an n-type impurity into the aforementioned drain region through the connection bole 42 by an ion implantation.

Although, moreover, the field effect transistor of the memory cell is formed in the Embodiments I to III to have the LDD structure, the present invention should not be limited thereto but the sour/drain regions may use the single drain structure, the double drain (or doubly diffused) structure or these structures selectively.

Although, still moreover, the source line is formed in the Embodiment II of the semiconductor region formed over the principal face of the semiconductor substrate, the present invention should not be limited thereto but may be modified such that the source line is formed of a conductive layer buried between the control gate electrodes like the Embodiment I. Since, furthermore, the source line is formed of the conductive layer buried between the control gate electrodes in the Embodiments I, II and IV, it should not be limited thereto but may be formed of a semiconductor region over the principal face of the semiconductor substrate.

[Embodiment V]

The present Embodiment V is a fifth embodiment, in which the present invention is applied to a NOR-gate type mask ROM. Incidentally, the mask. ROM will be briefly described because it is specifically disclosed in Japanese Patent Laid-Open No. 58-111364, for example.

Figure 12:
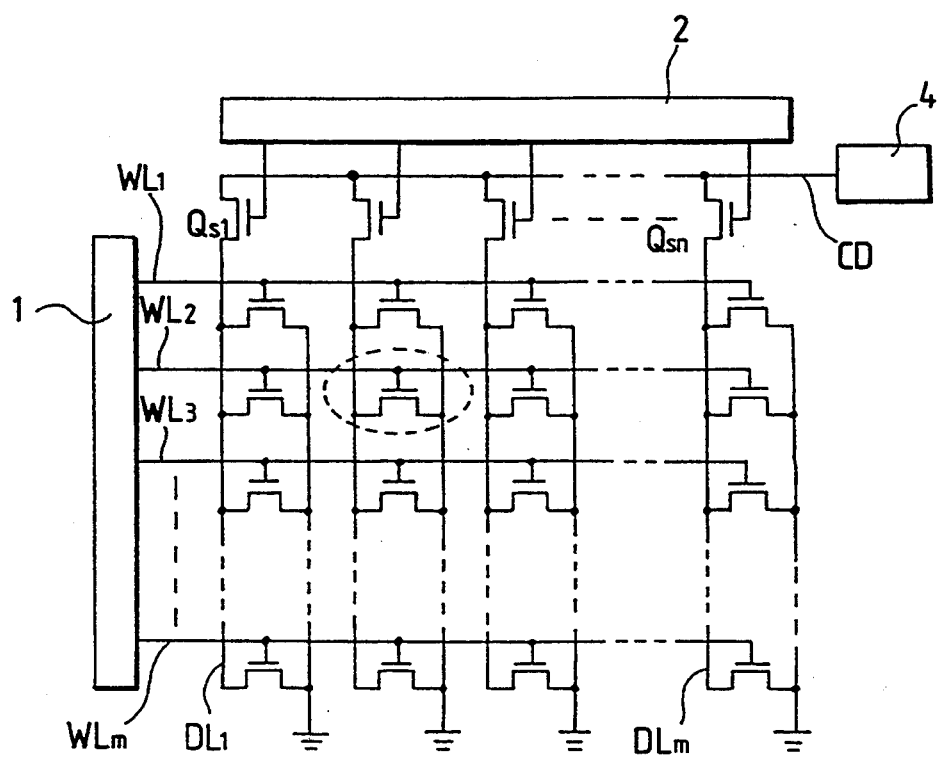
FIG. 12 is an equivalent circuit diagram showing a memory cell array of a transverse masked ROM according to Embodiment V of the present invention.

The circuitry of the memory cell array of a NOR-gate type mask ROM according to the Embodiment V and packaged in the semiconductor integrated circuit device is shown in FIG. 12 (presenting an equivalent circuit diagram).

Each memory cell is composed of an N-channel MISFET and is arranged in a matrix shape. Each has its gate connected with a word line WL extending from an X-decoder circuit 1, its drain connected with a data line DL extending from a Y-decoder circuit 2 through a column switching MISFET Qs, and its source grounded to the earth. Moreover, one of the source/drain regions of the column switching MISFET Qs is connected with a sense amplifier 4 through a common data line CD.

The write of data in each cell is carried, as will be described hereinafter, by selectively ion-implanting an impurity of a conduction type identical to that of the substrate through the gate electrode to raise the Vth of the MISFET (as enclosed by a broken curve in FIG. 12) of a predetermined memory element.

Figure 13:
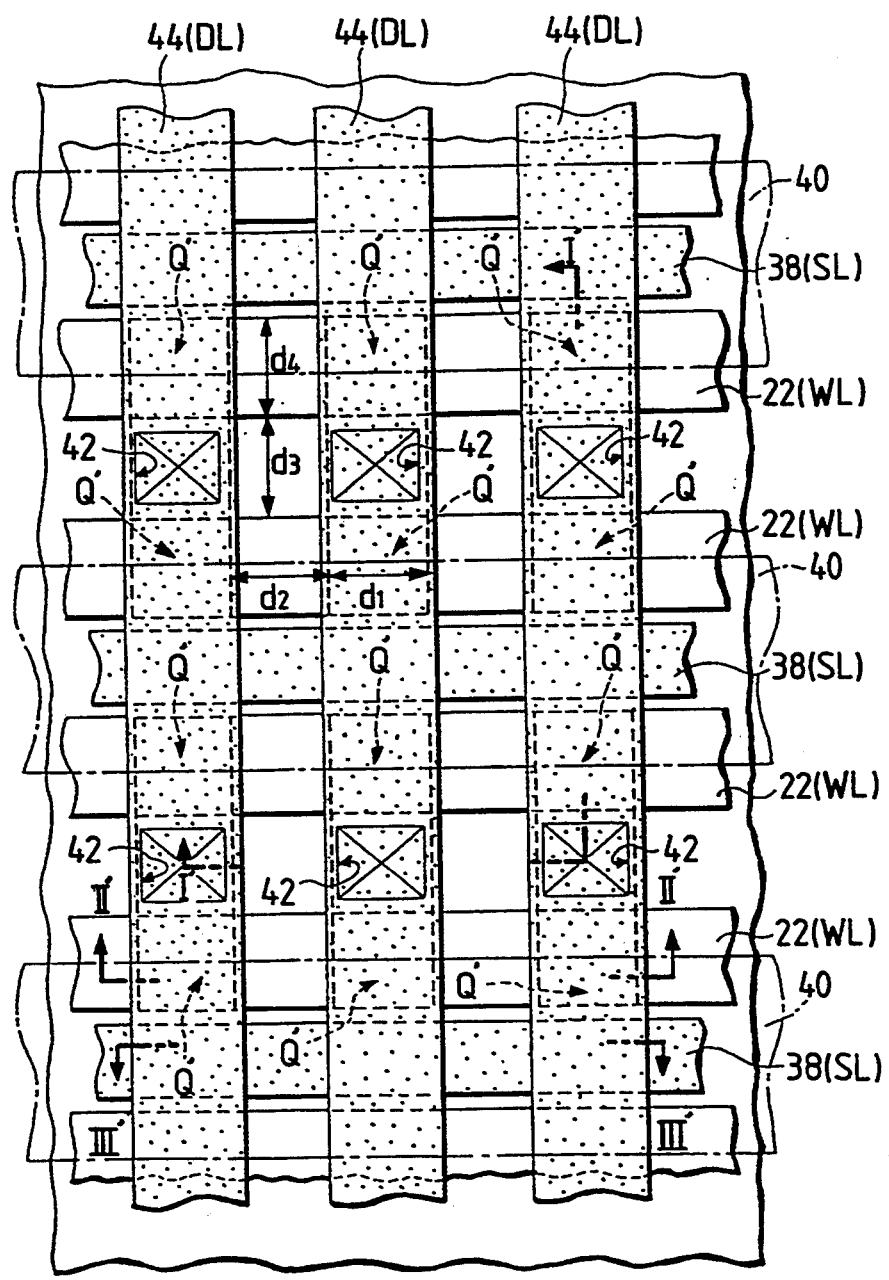
FIG. 13 is a top plan view showing the memory cell array of the aforementioned transverse masked ROM.
Figure 14A:
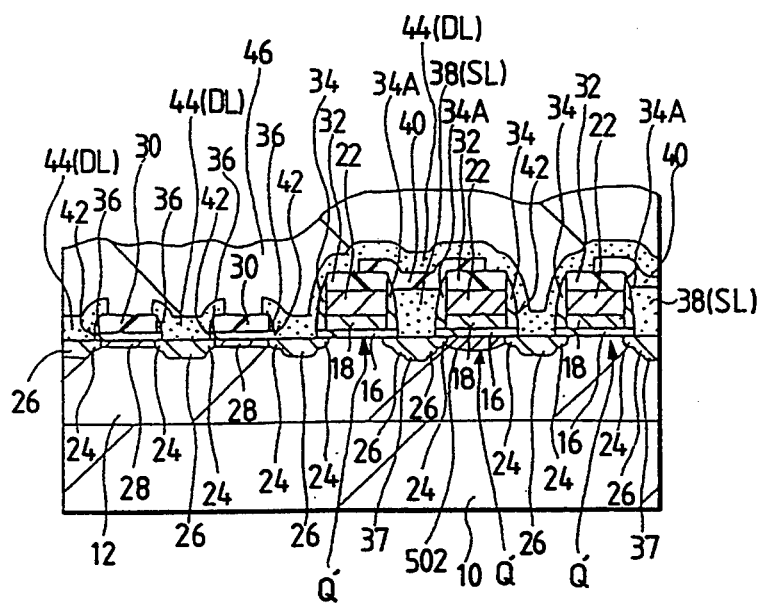
FIG. 14A is a section taken along line I'—I' of FIG. 13.
Figure 14B:
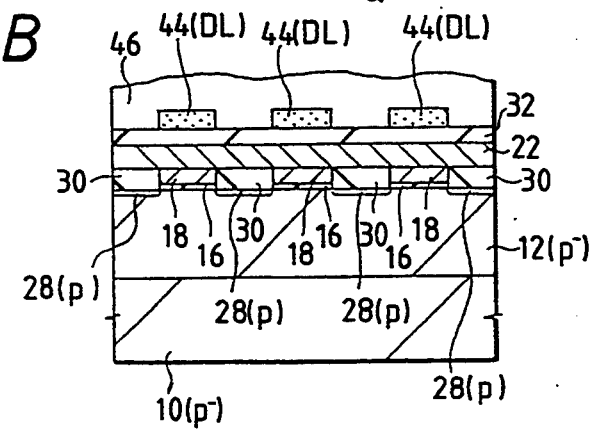
FIG. 14B is a section taken along line II'—II' of FIG. 13.
Figure 14C:
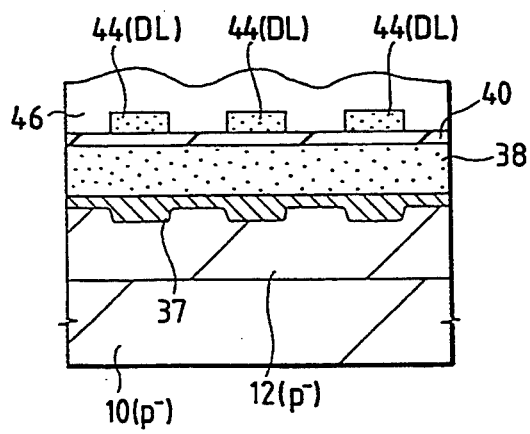
FIG. 14C is a section taken along line III'—III' of FIG. 13.

Next, the specific structure of the memory cell of the aforementioned NOR-gate type mask ROM will be briefly described in the following. FIG. 13 is a top plan view showing a portion of the memory cell array. FIG. 14A is a section taken along line I'—I' of FIG. 13; FIG. 14B is a section taken along line II'—II'of FIG. 13; and FIG. 14C is a section taken along line III'—III' of FIG. 13.

As shown in FIG. 13 and FIGS. 14A and 14B, the memory cell of the NOR-gate type mask ROM is composed of a field effect transistor Q'. This field effect transistor Q' is substantially identical to the field effect transistor Q of the memory cell M of the foregoing Embodiment I excepting that the insulating film 20 is omitted. In other words, the field effect transistor Q' is composed of a p⁻-type well region 12, a gate insulating film 18, gate electrodes 18 and 22, and a pair of n-type semiconductor regions 24 and a pair of n+-type semiconductor regions 26 for providing the source and drain regions. The aforementioned p⁻-type well region 12 is used as a channel forming region. In short, the field effect transistor Q' or the memory cell is constructed to have a one-layer gate structure and an LDD structure.

On the other hand, the gate electrode 22 is integrated with the gate electrode 22 of the field effect transistor Q' or another memory cell, which is arranged adjacent to the former gate electrode 22 in the column direction, to constitute the word line WL.

Figure 15A:
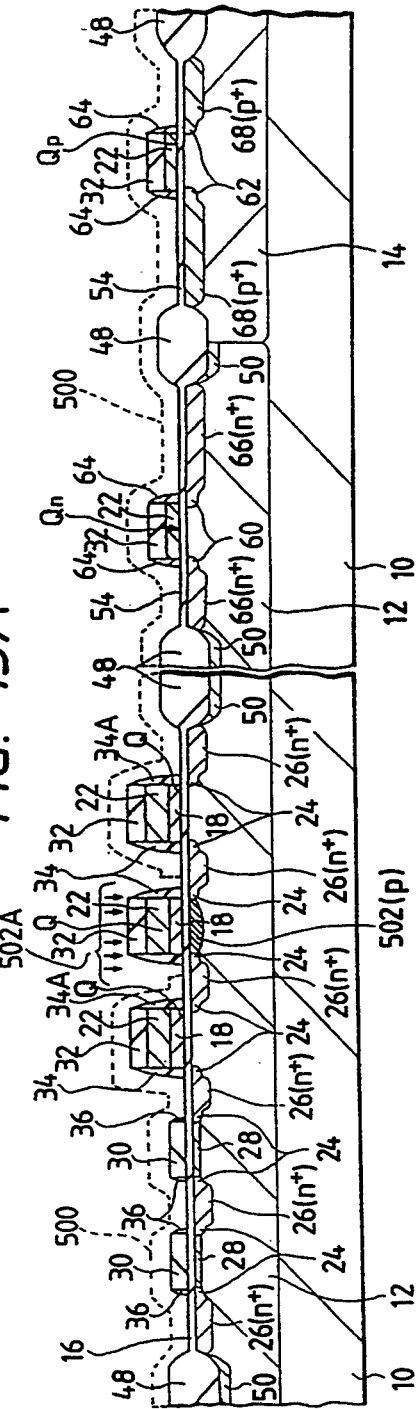
FIGS. 15A to 15B are sections showing an essential portion of the aforementioned transverse masked ROM at individual fabrication steps.
Figure 15B:
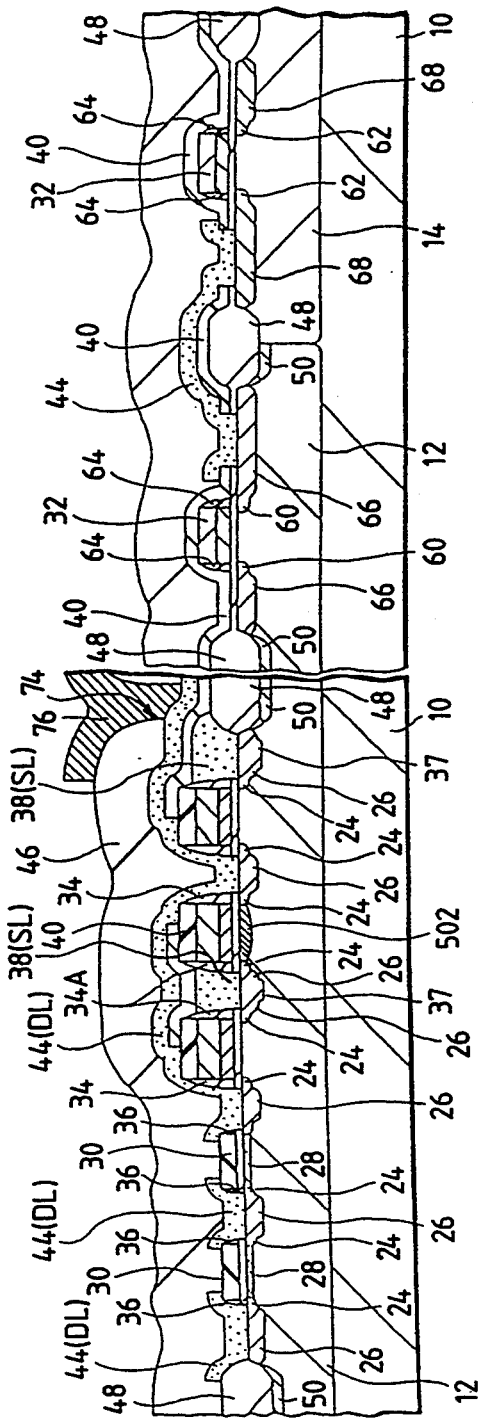

Incidentally, in FIGS. 15A and 15B, the lefthand side shows the memory cell forming region, and the righthand side shows the peripheral circuit forming region. The memory cell forming region is one near the peripheral circuit forming region and presents a section corresponding to that taken along line I'—I'of FIG. 13.

Next, the process for fabricating the NOR-gate type mask ROM thus constructed will be briefly described with reference to FIGS. 15A and 15B (presenting sections of an essential portion of the memory cell array at predetermined fabrication steps).

This process follows the aforementioned steps of FIGS. 4A to 4J of the fabrication process of the foregoing Embodiment I excepting the step of forming the insulating film 20 in the Embodiment I. After this, as shown in FIG. 15A, the memory cell forming region is subjected to an ion implantation for writing data by using a photo resist 500 as the mask, for example, to form a doped region 502.

The Vth of the field effect transistor Q' thus doped is raised to about 8 V. On the contrary, the Vth of the field effect transistor Q' left undoped is at about 0.6 V, for example.

Incidentally, the impurity ion implanting conditions for data writing are selected by using boron ions 504, for example, variously from the ranges of the implanting energy 40 to 500 KeV and the dosage of $10^1$ to $10^{14}$ [atoms/cm$^2$] in accordance with the situations. In other words, the implanting energy is determined from the thicknesses of the gate electrode and the gate oxide film, and the dosage is determined on what level the Vth is to be changed to.

Next, after the photo resist mask 500 has been removed, the source line 38, the inter-layer insulating film, the insulating films 34 and 36, the wiring layer 44, the inter-layer insulating film 46 and the wiring layer 76 are sequentially formed to complete the NOR-gate type mask ROM, as shown in FIG. 15B.

The NOR-gate type mask ROM thus constructed can achieve effects similar to those of the foregoing Embodiment I.

[Embodiment VI]

The present Embodiment VI is a sixth embodiment in which the present invention is applied to a NAND-gate type mask ROM. Incidentally, the mask ROM will be briefly described because it is described in detail in Japanese Patent Laid-Open No. 63-122163, for example.

Figure 16:
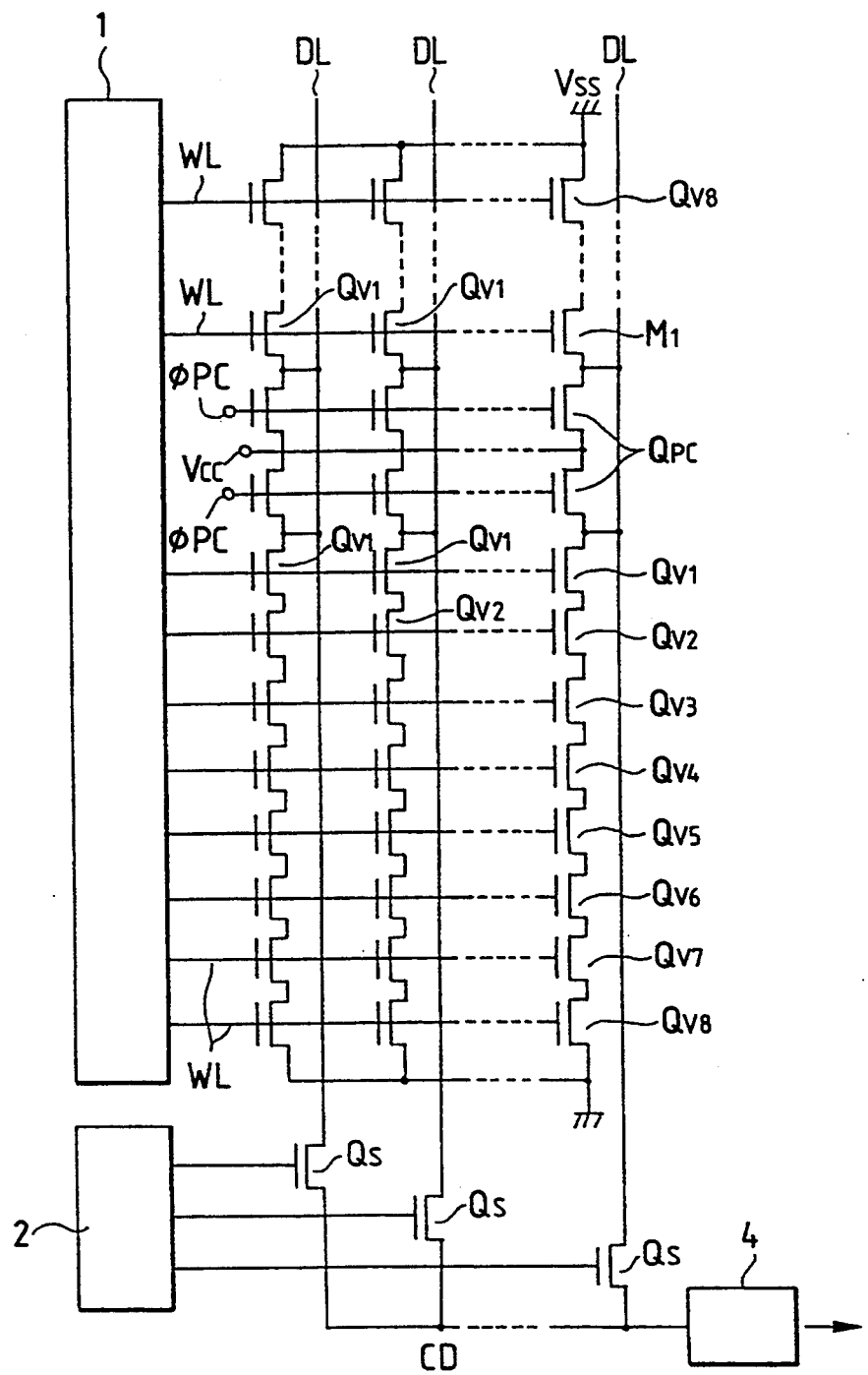
FIG. 16 is an equivalent circuit diagram showing a memory cell array of a longitudinal masked ROM according to Embodiment VI of the present invention.
Figure 17:
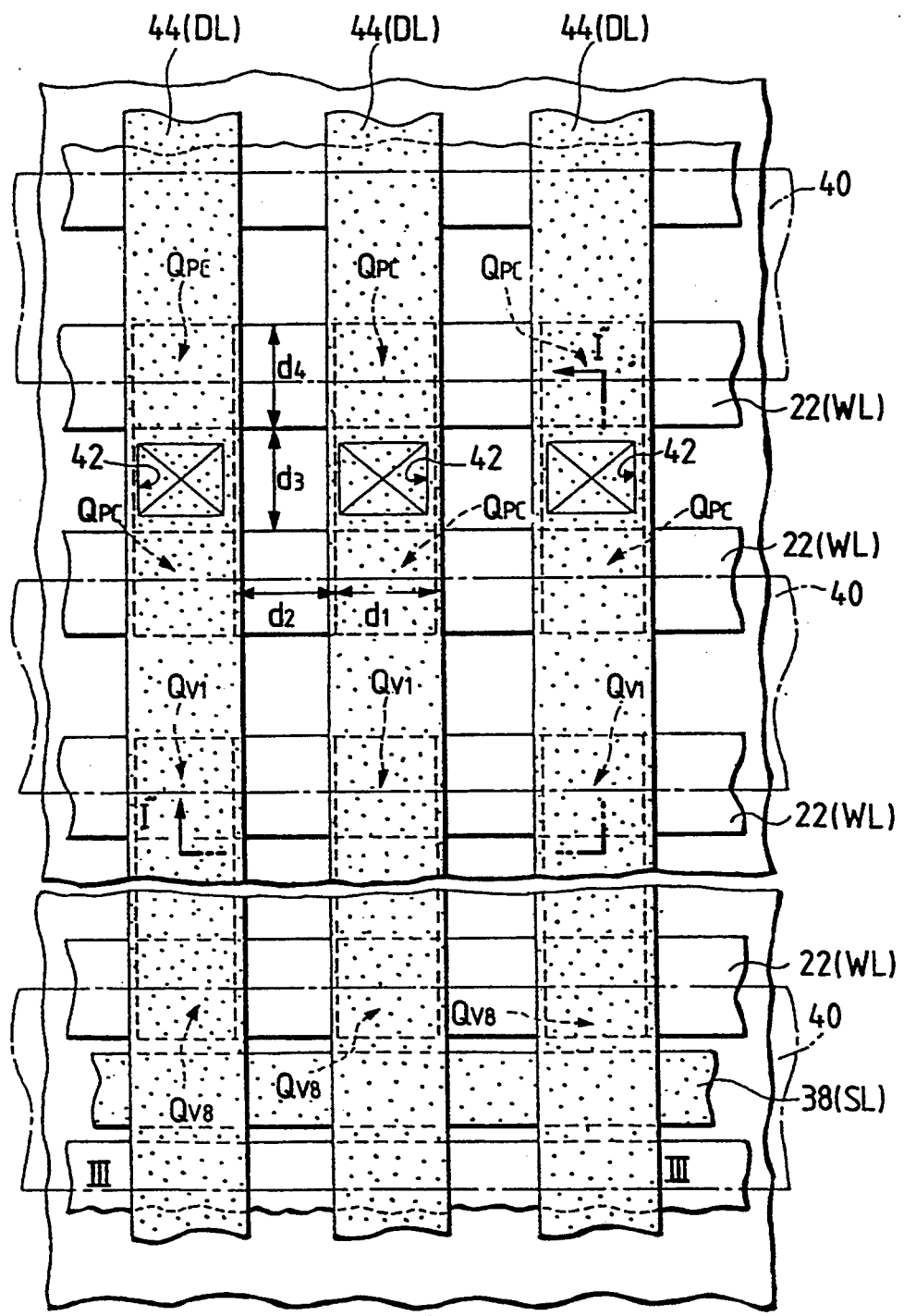
FIG. 17 is a top plan view showing the memory cell array of the aforementioned longitudinal masked ROM.
Figure 18:
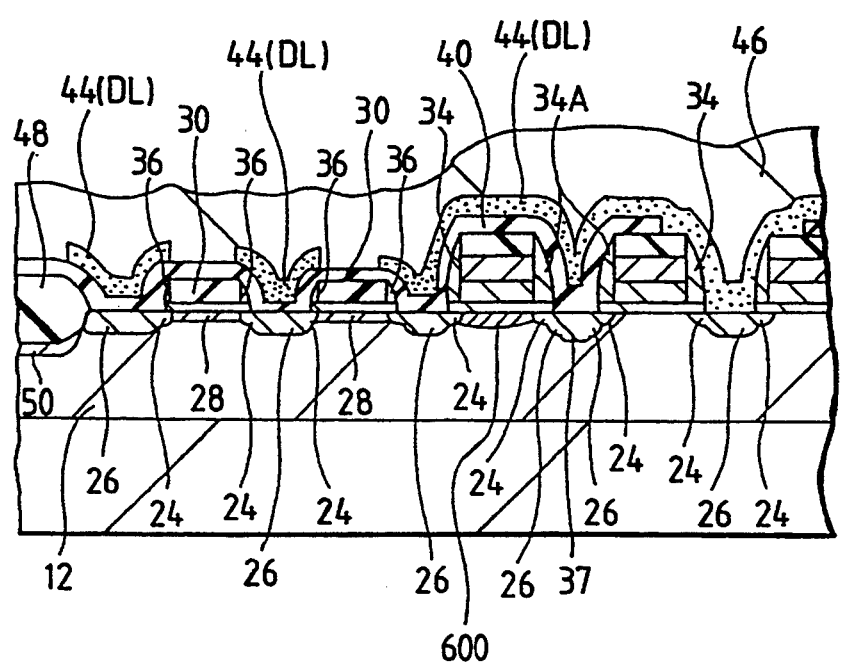
FIG. 18 is a section taken along line I"—I' of FIG. 17.

The circuitry of the memory cell array of the NAND-gate type mask ROM according to the Embodiment VI of the present invention and packaged in the semiconductor integrated circuit device is shown in FIG. 16 (presenting an equivalent circuit diagram), FIG. 17 (presenting a top plan view showing an essential portion of the memory cell array of the NAND-gate type mask ROM) and FIG. 18 (presenting a section taken along line I"—I" of FIG. 17.

As shown in FIGS. 15 and 17, the memory cell array of the NAND-gate type mask ROM is arranged with memory cells Qv1 to Qv2, which are composed of MIS capacitors or MISFETs (both of which will be shortly referred as "MISFETs"). The memory cells Qv1 to Qv8 are connected in series. These eight (or sixteen, thirty two, - - -, and so on) memory cells Qv1 to Qv8 constitute altogether a unit memory cell having 8 bits (or 16 bits, 32 bits, - - -, and so on).

The aforementioned memory cell Qv is composed of a depression type (having a first threshold voltage)

MISFET for providing "0" data or an enhancement type (having a second threshold voltage) MISFET for providing "1" data. The memory cells Qv1 to Qv8 have their individual gate electrodes connected with word lines WL extending in the column direction. This word line WL is constructed to control the conduction and inconduction of the memory cell Qv. Each word line WL has its one end connected with an X-decoder circuit 1.

The drain of the memory cell Qv1 of the unit memory cell row, i.e., the MISFET constituting the memory cell Qv1 is connected with the data line DL extending in the row direction and further with a supply voltage Vcc through a precharging MISFET Qpc which has its gate electrode supplied with a precharge signal $\phi pc$. The supply voltage Vcc is the operating voltage 5 [IV] of the circuit, for example. The data line DL has its one end connected with a common data line CD through a MISFET Qs constituting a column switch. The gate electrode of the MISFET Qs is connected with a Y-decoder circuit 2. The source of the MISFET constituting the memory cell Qv8 at the other end of the memory cell row is connected with a reference voltage Vss. This reference voltage Vss is at the earth potential 0 [V] of the circuit, for example. The supply voltage Vcc and the reference voltage Vss are individually shared by a plurality of unit memory cell rows arranged in the column direction to constitute a supply voltage wiring line and a reference voltage wiring line, respectively.

The unit memory cell rows are disposed symmetrically in one pair in the row direction with respect to the aforementioned precharging MISFET Qpc. These paired unit memory cell rows are arranged in a repeated pattern in the column direction to constitute the memory cell array.

As shown in FIGS. 17 and 18, the field effect transistor Qv or the memory cell of the NAND-gate type mask ROM is constructed to have a structure substantially identical to that of the field effect transistor Q' or the memory cell of the foregoing Embodiment V. Moreover, the memory cell array of the NAND-gate type mask ROM can be formed by a fabrication process substantially identical to that of the foregoing Embodiment V excepting that the data line 44 (DL) and the source line 38 (SL) are formed in the different positions.

On the other hand, the memory cell Qv is formed in advance (before the data write) with the depression type threshold voltage, which is changed into the enhancement by introducing the data writing impurity.

The introduction of this data writing impurity is carried out like the foregoing Embodiment V by an ion implantation of an energy of about 100 to 500 [KeV] using B+ of about $10^{10}$ to $10^{14}$ [atoms/cm$^2$], for example. As a result a doped region 600 is formed to change the threshold voltage of the memory cell Qv from the depression type into the enhancement type.

The NAND-gate type mask ROM thus constructed can achieve effects similar to those of the foregoing Embodiment I.

The effects to be obtained from the representatives of the invention thus far described will be briefly described in the following.

It is possible to improve the degree of integration of the semiconductor integrated circuit device having a nonvolatile memory function.

It is also possible to form a memory cell which is regulated to the minimum treating size in the fabrication process of the semiconductor integrated circuit device.

It is also possible to speed up the operations of the semiconductor integrated circuit device.

It is also possible to improve the electric reliability of the semiconductor integrated circuit device.

What is claimed is:

1. A process for fabricating a semiconductor integrated circuit device including a field effect transistor having a floating gate electrode and a control gate electrode, comprising:

the step of forming a first conductive layer over a gate insulating film which is over a principal surface of a substrate;

the step of forming first gaps, in a first direction, in said first conductive layer, by patterning said first conductive layer;

the step of forming a first insulating film buried in the first gaps in the first conductive layer, wherein said first insulating film has its surface substantially coextensive with that of the first conductive layer;

the step of forming a second insulating film over said first conductive layer and said first insulating film;

the step of forming the control gate electrode and the floating gate electrode, of the field effect transistor, at a second gap, in a second direction perpendicular to said first direction, and forming source/drain regions of the field effect transistor;

the step of forming a third insulating film in self-alignment with side walls of said floating gate electrode and said control gate electrode and side walls of said first insulating film, and of forming a connection hole regulated by said third insulating film over said drain region; and the step of forming a wiring line to be connected with said drain region through said connection hole.

2. A process for fabricating a semiconductor integrated circuit device according to claim 1, wherein said control gate electrode is formed by patterning said second conductive layer in a manner to extend in said second direction and at said second gap in said second direction, to form the word line.

3. A process for fabricating a semiconductor integrated circuit device according to claim 2, including a further step of connecting the wiring line to the source region of the field effect transistor, wherein the wiring line connected with the source region of said field effect transistor is formed of a conductive layer which is buried between insulating films formed in self-alignment with side walls of a word line adjacent to said source region.

4. A method of fabricating a semiconductor device including MISFETs with floating gate electrodes and control gate electrodes, said method comprising the steps of:

forming a gate insulating film over a principal surface of a semiconductor substrate;

forming a first conductive layer over said gate insulating film;

forming first conductive strips by selectively removing said first conductive layer in such a manner that a first gap in a first direction is formed between adjacent first conductive strips;

forming first insulating films buried between said first conductive strips;

forming a second insulating film over said first conductive strips and said first insulating films;

forming a second conductive layer over said second insulating film;

forming a third insulating film over said second conductive layer;

after forming the third insulating film, forming second conductive strips and floating gate electrodes by selectively removing said second conductive layer and said first conductive strips, respectively, wherein said second conductive layer is selectively removed in such a manner that a second gap in a second direction perpendicular to said first direction is formed between adjacent second conductive strips, wherein said first conductive strips are selectively removed in such a manner that said second gap in said second direction perpendicular to said first direction is formed between adjacent floating gate electrodes, wherein control gate electrodes are integrally formed with said second conductive strips, wherein, in the step of forming second conductive strips and floating gate electrodes, said third insulating film, said second conductive layer, said second insulating film, and said first conductive strips are successively removed in such a manner that remaining portions of said third insulating film have a same pattern as that of said second conductive strips;

introducing an impurity, into said semiconductor substrate, within areas of said main surface each surrounded by said second conductive strips and said first insulating films so as to form drain regions of said MISFETs in said semiconductor substrate;

forming a side wall spacer comprised of an insulating material in self-alignment with side surfaces of said first insulating films, said floating gate electrodes, said control gate electrodes, and said remaining portions of said third insulating film, wherein contact holes over said drain regions are defined by said side wall spacer; and forming wiring lines each extending in said second direction, wherein said wiring lines are formed over said second conductive strips, said drain regions, and said side wall spacer, and wherein said wiring line is electrically connected with said drain regions through said contact holes, said wiring lines serving as data lines.

5. A method of fabricating a semiconductor device according to claim 4, wherein the step of forming said side wall spacer includes substeps of forming a fourth insulating film over said second conductive strips and said second insulating film by chemical vapor deposition, and etching back said fourth insulating film.

6. A method of fabricating a semiconductor device according to claim 4, wherein the step of forming said first insulating film includes substeps of forming a fifth insulating film by chemical vapor deposition over said first conductive strips so as to cover said principal surface, and etching said fifth insulating film.

7. A method of fabricating a semiconductor device according to claim 6, wherein said wiring lines are formed on said side wall spacer in self-alignment with said side wall spacer and are electrically connected with said drain regions arranged in said second direction.

8. A method of fabricating a semiconductor device according to claim 6, wherein said etching said fifth insulating film is performed such that a surface of the first insulating film and a surface of the first conductive strips are co-extensive.

9. A method of fabricating a semiconductor device according to claim 2, wherein the step of forming said third insulating film includes substeps of forming a fourth insulating film by chemical vapor deposition over said control gate electrode so as to cover said principal surface, and etching said fourth insulating film, and wherein the step of forming said first insulating film includes substeps of forming a fifth insulating film by chemical vapor deposition over said first conductive layer so as to cover said principal surface, and etching said fifth insulating film.

10. A method of fabricating a semiconductor device according to claim 9, wherein said wiring line is formed on said third insulating film in self-alignment with said third insulating film and is electrically connected with said drain region.

11. A method of fabricating a semiconductor device according to claim 4, wherein said wiring lines are formed on said side wall spacer in self-alignment with said side wall spacer and are electrically connected with said drain regions arranged in said second direction.

12. A method of fabricating a semiconductor device according to claim 5, wherein said wiring lines are formed on said side wall spacer in self-alignment with said side wall spacer and are electrically connected with said drain regions arranged in said second direction.

13. A method of fabricating a semiconductor device according to claim 4, wherein the second conductive layer, the second insulating film, and the first conductive strips are successively selectively removed using a common mask.

14. A method of fabricating a semiconductor device according to claim 13, wherein the third insulating film is also selectively removed using said common mask.

15. A method of fabricating a semiconductor device according to claim 4, wherein a selection ratio of (a) removing material of the first conductive strips to (b) removing material of the first insulating films, when removing first conductive strips in forming the second conductive strips and floating gate electrodes, is at least 20.

16. A method of fabricating a semiconductor device according to claim 4, wherein the third insulating film is formed so as to have a substantially flattened surface.

17. A method of fabricating a semiconductor device according to claim 9, wherein the fifth insulating film has a thickness that is at least $\frac{1}{2}$ of a width of one of the first gaps.

* * * * *